(12) United States Patent
Yang et al.

(10) Patent No.: US 9,343,591 B2
(45) Date of Patent: May 17, 2016

(54) METHODS OF PRINTING SOLAR CELL CONTACTS

(71) Applicant: Heraeus Precious Metals North America Conshohocken LLC, West Conshohocken, PA (US)

(72) Inventors: Yi Yang, San Diego, CA (US); Aziz S. Shaikh, San Diego, CA (US); Kristina McVicker, Vista, CA (US); Klaus Kunze, Carlsbad, CA (US); Srinivasan Sridharan, Strongsville, OH (US)

(73) Assignee: Heracus Precious Metals North America Conshohocken LLC, West Conshohocken, PA (US)

( * ) Notice: Subject to any disclaimer, the term of this patent is extended or adjusted under 35 U.S.C. 154(b) by 0 days.

(21) Appl. No.: 14/394,651

(22) PCT Filed: Apr. 18, 2013

(86) PCT No.: PCT/US2013/037145
§ 371 (c)(1),
(2) Date: Oct. 15, 2014

(87) PCT Pub. No.: WO2013/158864
PCT Pub. Date: Oct. 24, 2013

(65) Prior Publication Data
US 2015/0072463 A1    Mar. 12, 2015

Related U.S. Application Data

(60) Provisional application No. 61/635,262, filed on Apr. 18, 2012.

(51) Int. Cl.
*H01L 31/02*    (2006.01)
*H01L 31/0216*    (2014.01)
(Continued)

(52) U.S. Cl.
CPC ...... *H01L 31/0201* (2013.01); *H01L 31/02168* (2013.01); *H01L 31/022425* (2013.01); *H01L 31/068* (2013.01); *H01L 31/188* (2013.01); *Y02E 10/547* (2013.01)

(58) Field of Classification Search
None
See application file for complete search history.

(56) References Cited

U.S. PATENT DOCUMENTS 8,057,850 B2    11/2011    Curtis et al.
2006/0289055 A1    12/2006    Sridharan et al.
(Continued)

FOREIGN PATENT DOCUMENTS

CN    101432690    5/2009
CN    101663711 A    3/2010
(Continued)

OTHER PUBLICATIONS

Galiazzo, et al., Double Printing of Front Contact Ag in c-Si solar cells, Proceedings of the 25th European Photovoltaic Solar Energy Conference Sep. 6-10, 2010, Retrieved from the Internet: http://www.eupvsec-proceedings.com/proceedings?paper=7654, section 1, Figure 1, section 3.
(Continued)

*Primary Examiner* — Asok K Sarkar
(74) *Attorney, Agent, or Firm* — Blank Rome LLP; Charles R. Wolfe, Jr.; Jamie B. Tesfazion

(57) ABSTRACT

Silicon solar cells and contacts thereof are printed in at least a two stage printing process where the busbars and fingerlines may be printed separately. A reduction in silver content in busbars and fingerlines through use of the techniques of the invention have been realized, including the use of certain base metals, while maintaining low contact resistance similar to silve pastes.

13 Claims, 9 Drawing Sheets

(51) Int. Cl.
*H01L 31/0224* (2006.01)
*H01L 31/068* (2012.01)
*H01L 31/18* (2006.01)

(56) References Cited

U.S. PATENT DOCUMENTS

| | | |
|---|---|---|
| 2007/0215202 A1 | 9/2007 | Salami et al. |
| 2009/0061077 A1 | 3/2009 | King et al. |
| 2009/0095344 A1 | 4/2009 | Machida et al. |
| 2009/0255583 A1 | 10/2009 | Young et al. |
| 2010/0163101 A1 | 7/2010 | Kumar et al. |
| 2010/0173446 A1 | 7/2010 | Khadilkar et al. |
| 2010/0294359 A1 | 11/2010 | Anderson et al. |
| 2010/0294360 A1 | 11/2010 | Anderson et al. |
| 2010/0300522 A1 | 12/2010 | Ginley et al. |
| 2011/0308601 A1 | 12/2011 | Kim et al. |
| 2012/0015472 A1 | 1/2012 | Hayashi et al. |
| 2012/0085401 A1 | 4/2012 | Borland et al. |
| 2015/0068592 A1* | 3/2015 | Kommera ........... H01L 31/0201 136/256 |

FOREIGN PATENT DOCUMENTS

| | | |
|---|---|---|
| CN | 102290453 | 12/2011 |
| EP | 729189 A1 | 8/1996 |
| WO | WO-2011026892 A1 | 3/2011 |
| WO | WO-2012058358 A1 | 5/2012 |

OTHER PUBLICATIONS

International Search Report issued in PCT/US13/37145 dated Sep. 16, 2013.
Extended European Search Report for PCT/US2013/037145, dated Oct. 27, 2015, 7 pages.

* cited by examiner

Print schemes

Fig. 4

| Scheme | 1st print(bottom layer) | 2nd print (top layer) | 3rd print (2nd top layer) |
|---|---|---|---|
| 5 | Fingers (continuous)<br>SP/StP<br>A | Entire grid(Fingers + busbar)<br>SP<br>A | |
| | Fingers (continuous)<br>SP/StP<br>A | Fingers (continuous)<br>SP<br>A,B or C | Busbars<br>SP<br>B |

| Scheme | 1st print (bottom layer) | 2nd print (top layer) | 3rd print (2nd top layer) |
|---|---|---|---|
| 9 | Entire grid(Fingers + busbar) SP + StP A | Entire grid(Finger + busbars) SP A, B or C | |

| 10 | Busbars SP B | Fingers (split lines at busbar) SP A | Fingers (split lines at busbar) SP A, B or C |
|---|---|---|---|

METHODS OF PRINTING SOLAR CELL CONTACTS

RELATED APPLICATION

This is a U.S. national phase of International Patent Application No. PCT/US2013/037145, filed Apr. 18, 2013, which claims the benefit of U.S. Provisional Application No. 61/635,262, filed on Apr. 18, 2012, the entire disclosure of which is incorporated herein by reference in its entirety.

TECHNICAL FIELD

The invention generally relates to a paste composition, a method of making a paste composition, a method of making a solar cell contact, and a fired contact that can be used in solar cells as well as other related components. Preferably, the paste comprises silver.

BACKGROUND

Solar cells are generally made of semiconductor materials, such as silicon (Si), which convert sunlight into useful electrical energy. Solar cells are typically made of thin wafers of Si in which the required PN junction is formed by diffusing phosphorus (P) or Boron (B) from a suitable phosphorus or Boron source into a P-type or N-type Si wafer. The side of silicon wafer on which sunlight is incident is in general coated with an anti-reflective coating (ARC) to prevent reflective loss of incoming sunlight, and also it acts as passivation layer to prevent the recombination of photo-generated carriers thus to increase the efficiency of the solar cell. A two dimensional electrode grid pattern known as a front contact makes a connection to the N-side or P-side of P-type Si or N-type Si, and a coating of aluminum (Al) or Silver (Ag) on the other side (back contact) makes connection to the P-side or N-Side of the silicon. These contacts are the electrical outlets from the PN junction to the outside load.

Front contacts of silicon solar cells are formed by screen-printing a thick film paste. Typically, the paste contains appropriately fine silver particles, glass and organics. After screen-printing, the wafer and paste are fired in air, typically at furnace set temperatures. During the firing, glass softens, melts, and reacts with the anti-reflective coating, etches the silicon surface, and facilitates the formation of intimate silicon-silver contact. Silver deposits on silicon as islands. The shape, size, and number of silicon-silver islands determine the efficiency of electron transfer from silicon to the outside circuit.

SUMMARY OF THE INVENTION

The invention is generally directed to silicon solar cells and contacts thereof where the busbars and fingerlines are printed in at least a two stage printing process. The inventors have realized a reduction in silver content in the busbars and fingerlines through use of the techniques of the invention, including the use of certain base metals, while maintaining low contact resistance similar to silver pastes.

Several different printing schemes have been developed, all of which have the aim of low silver lay down, which reduce costs of solar cell manufacture while maintaining high cell efficiency.

By having the flexibility to independently choose deposition methods combined with paste compositions individually tailored to deposition method and print sequence allows reduced amount of silver needed (low lay down).

For example, by depositing narrower and taller lines using double printing the amount of silver needed in the finger top layer can be reduced (for example by using compositions with lower Ag content in the 2nd print) while still maintaining high efficiency. Similarly, reducing the amount of silver can also be achieved by printing thinner busbars or printing busbars with low temperature sintering Ag polymer pastes.

Certain printing schemes have the advantage that misalignments, resulting in fingers with increased line width and lower aspect ratio, can be avoided because fingers are not double printed.

Paste compositions for both fingers and busbars can be different, and therefore can be independently selected to maximize their desired performance characteristics during printing and after firing. For example, the busbar paste can be optimized for good adhesion and solder wetting, while the finger paste can be optimized for ultra narrow, high aspect ratio line printing, low bulk resistivity and low contact resistance.

In certain schemes all three pastes can be individually tailored to maximize certain performance characteristics according to their print method and desired electrical, adhesion, solderability characteristics.

The various schemes may be summarized in the following Table 1:

TABLE 1

Summary of multistep printing schemes

| Scheme | $1^{st}$ print (bottom layer) | $2^{nd}$ print (top layer) | $3^{rd}$ print ($2^{nd}$ top layer) | Best method |
|---|---|---|---|---|
| 1 | Fingers (split lines at busbar) | Entire grid (Fingers + busbars) | | $1^{st}$ print: SP of A $2^{nd}$ print: SP of B |
| | SP/StP A | SP B | | |
| 2 | Fingers (split lines at busbar) | Busbars | | $1^{st}$ print: StP of HM version of A $2^{nd}$ print: SP of B |
| | SP/StP A | SP B | | |
| 3 | Busbars | Fingers (split lines at busbar) | | $1^{st}$ print: SP of B $2^{nd}$ print: StP of HM version of A |
| | SP B | SP/StP A | | |
| 4 | Fingers (split lines at busbar) | Fingers (split lines at busbar) | Busbars | $1^{st}$ print: SP of A $2^{nd}$ print: SP of A, B or C $3^{rd}$ print: SP of B |
| | SP/StP A | SP A, B or C | SP B | |
| 5 | Fingers (continuous) | Entire grid (Fingers + busbars) | | $1^{st}$: SP of A $2^{nd}$: SP of B |
| | SP/StP A | SP B | | |
| 6 | Fingers (continuous) | Fingers (continuous) | Busbars | $1^{st}$: SP of A $2^{nd}$: SP of C $3^{rd}$: SP of B |
| | SP/StP A | SP A, B or C | SP B | |

TABLE 1-continued

Summary of multistep printing schemes

| Scheme | 1st print (bottom layer) | 2nd print (top layer) | 3rd print (2nd top layer) | Best method |
|---|---|---|---|---|
| 7 | Entire grid (Fingers + busbars) SP/StP A | Fingers (split lines at busbar) SP A, B or C | | 1st: SP of A 2nd: SP of C |
| 8 | Entire grid (Fingers + busbars) SP/StP A | Fingers (continuous) SP A, B or C | | 1st: SP of A 2nd: SP of C |
| 9 | Entire grid (Fingers + busbars) SP/StP A | Entire grid (Fingers + busbars) SP A, B or C | | 1st: SP of A 2nd: SP of C |
| 10 | Fingers (split lines at busbar) SP B | Fingers (split lines at busbar) SP A | Fingers (split lines at busbar) SP A, B or C | 1st: SP of B 2nd: SP of A 3rd: SP of A, B or C |

In the table above, SP means screen-print; StP means stencil print; and HM means hot-melt. Hot melt versions of appropriate pastes A, B, and C may be used in all printing schemes listed in the table above. In general, ink jet printing (IJP) may also be used in a double print type application to form an electrode. In one scenario, IJP may be advantageously used to print the first layer of the fingers (to allow for good contact between the metal line and the semiconductor layer after firing). In another example, IJP may be used to print an etchant paste followed by printing of the finger metal lines (in this case, printing of the finger metal lines may be carried out in one pass or by double printing according to this invention). In another scenario, IJP may be also be used to print thin busbars, before or after the fingers have been printed (allowing for decreased laydown of silver in the busbars).

Pastes A, B, and C will be defined in detail hereinbelow.

The print schemes detailed in the table above are presented schematically in FIGS. 2-9. FIG. 2 depicts a top view of two solar cell substrates according to Schemes 1 and 2. FIG. 7 depicts a perspective top view of the solar cell substrate according to Scheme 1. Scheme 1 illustrates an embodiment of the invention which is a process of forming a front-side solar cell contact on a silicon wafer having a p-type region, an n-type region, a p-n junction and an ARC layer on said front-side, comprising: (a) applying an ARC layer to the front-side of the silicon wafer, (b) printing a paste A having fire-through capability on the ARC layer, wherein the paste A is printed as a plurality of thin parallel finger lines having gaps therein to form a bottom print of split finger lines, (b) printing a paste B over paste A, wherein the paste B is printed in a grid pattern comprising (i) at least two busbars intersecting the bottom print of split finger lines at right angles and interposed in the gaps therein, and (ii) thin parallel finger lines forming a top print of finger lines superimposing the bottom print of finger lines wherein the total printed area of pastes A and B is less than 10% of the area of the front-side, and (c) firing the double-printed silicon wafer, wherein the paste A comprises an organic vehicle and an inorganic portion comprising (a1) at least one electrically conductive metal powder and (a2) glass frit, the paste A providing lower contact resistance than paste B, when both are fired, and wherein the paste B comprises an organic vehicle and an inorganic portion comprising (b1) at least one electrically conductive metal powder and (b2) glass frit, the paste B providing, during firing, better solder wetting and adhesion to silicon than paste A when both are fired.

Scheme 2 is also depicted in FIG. 2 (bottom), as well as in FIG. 8. Scheme 2 is another embodiment of the invention which is a process of forming a front-side contact on a silicon wafer having a p-type region, an n-type region, a p-n junction and an ARC layer on said front-side, comprising: (a) printing a paste A having fire-through capability on the ARC layer through a stencil, wherein the paste A is printed as a plurality of thin parallel finger lines having gaps therein to form a bottom print of split finger lines, (b) printing and drying a paste B, wherein the paste B is printed in a grid pattern comprising at least two busbars intersecting the bottom print of split finger lines at right angles and interposed in the gaps therein, and (c) firing the double-printed silicon wafer, wherein the paste A comprises an organic vehicle and an inorganic portion comprising (a1) at least one electrically conductive metal powder and (a2) glass frit, the paste B providing, during firing, better solder wetting than paste A, when both are fired, and wherein the paste B comprises an organic vehicle and an inorganic content comprising (b1) at least one electrically conductive metal powder and (b2) glass frit, the paste A providing lower contact resistance than paste B when both are fired.

FIG. 3 is a top view of two solar cell substrates illustrating Schemes 3 and 4 of the invention. Scheme 3 is also depicted in FIG. 9 (the corresponding perspective view). Scheme 3 illustrates a process of forming a front-side contact on a silicon wafer having a p-type region, an n-type region, a p-n junction and an ARC layer on said front-side, comprising: (a) screen printing and drying a paste B having non fire-through capability to form at least two parallel busbars, (b) printing a paste A having fire-through capability on the ARC layer through a stencil, wherein the paste A is printed in a pattern comprising thin parallel split fingers connecting the at least two parallel busbars, and (c) firing the double-printed silicon wafer, wherein the paste A comprises a hot-melt adhesive and an inorganic portion comprising (a1) at least one electrically conductive metal powder and (a2) glass frit, the paste A providing lower contact resistance than paste B, when both are fired, and wherein the paste B comprises an organic vehicle and an inorganic content comprising (b1) at least one electrically conductive metal powder and (b2) glass frit, the paste B providing, during firing, better solder wetting and adhesion to silicon than paste A, when both are fired.

FIG. 3 further depicts Scheme 4 (bottom), yet another embodiment of the invention. Scheme 4 is a process of forming a front-side solar cell contact on a silicon wafer having a p-type region, an n-type region, a p-n junction and an ARC layer on said front-side, comprising: (a) applying an ARC layer to the front-side of the silicon wafer, (b) printing a first paste A having fire-through capability on the ARC layer, wherein the paste A is printed as a plurality of thin parallel finger lines having gaps therein to form a bottom print of split finger lines, (c) printing a second paste A or B or C over first paste A, wherein the second paste A or B or C is printed in a grid pattern comprising thin parallel finger lines forming a top print of finger lines superimposing the bottom print of finger lines, (d) printing a third paste B over the first and second pastes wherein the paste B is printed as at least two busbars intersecting the bottom print of split finger lines at right angles and interposed in the gaps therein, wherein the total printed area of the first, second and third pastes is less than 10% of the area of the front-side, and (e) firing the triple-printed silicon wafer, wherein the paste A comprises an organic vehicle and an inorganic portion comprising (a1) at least one electrically conductive metal powder and (a2) glass frit, the paste A providing lower contact resistance than paste B, when both are fired, and wherein the paste B comprises an organic vehicle and an inorganic content comprising (b1) at least one electrically conductive metal powder and (b2) glass frit, the paste B providing, during firing, better solder wetting and adhesion to silicon than paste A when both are fired, and wherein the paste C comprises an organic vehicle and an inorganic content comprising (c1) at least one electrically conductive metal powder and (c2) glass frit, the paste A providing lower contact resistance than paste C when both are fired.

FIG. 5 a top view of two solar cell substrates according to Schemes 7 and 8. Scheme 7 is a process of forming a front-side contact on a silicon wafer having a p-type region, an n-type region, a p-n junction and an ARC layer on said front-side, comprising (a) printing a paste A having fire-through capability on the ARC layer, wherein the paste A is printed in a grid pattern comprising (i) thin parallel finger lines forming a bottom print of finger lines and (ii) at least two parallel busbars intersecting the finger lines at right angles, (b) printing and drying a paste A, B, or C over the bottom print of finger lines, wherein the paste A, B, or C is printed in a grid pattern comprising thin parallel finger lines forming a top print of finger lines superimposing the bottom print of finger lines and (c) firing the double-printed silicon wafer, wherein the paste A comprises a hot-melt adhesive and an inorganic portion comprising (a1) at least one electrically conductive metal powder and (a2) glass frit, the paste A providing, during firing, better solder wetting and adhesion to silicon than paste B (or C), when both are fired, and wherein the paste C comprises an organic vehicle and an inorganic content comprising (c1) at least one electrically conductive metal powder and (c2) glass frit, the paste A providing lower contact resistance than paste C, when both are fired.

FIGS. 4 and 6 are also top views of solar cell substrates illustrating further embodiments of the invention according to Schemes 5, 6, 9 and 10.

Another aspect of the invention is a process of forming a front-side solar cell contact on a silicon wafer having a p-type region, an n-type region, a p-n junction and an ARC layer on said front-side, comprising: (a) applying an ARC layer to the front-side of the silicon wafer, (b) printing a first paste A having fire-through capability on the ARC layer, wherein the paste A is printed as a plurality of thin parallel finger lines having gaps therein to form a bottom print of split finger lines, (c) printing a second paste A or B or C over first paste A, wherein the second paste A or B or C is printed in a grid pattern comprising thin parallel finger lines forming a top print of finger lines superimposing the bottom print of finger lines, (d) printing a third paste B over the first and second pastes wherein the paste B is printed as at least two busbars intersecting the bottom print of split finger lines at right angles and interposed in the gaps therein, wherein the total printed area of the first, second and third pastes is less than 10% of the area of the front-side, and (e) firing the triple-printed silicon wafer, wherein the paste A comprises an organic vehicle and an inorganic portion comprising (a1) at least one electrically conductive metal powder and (a2) glass frit, the paste A providing lower contact resistance than paste B, when both are fired, and wherein the paste B comprises an organic vehicle and an inorganic content comprising (b1) at least one electrically conductive metal powder and (b2) glass frit, the paste B providing, during firing, better solder wetting and adhesion to silicon than paste A when both are fired, and wherein the paste C comprises an organic vehicle and an inorganic content comprising (c1) at least one electrically conductive metal powder and (c2) glass frit, the paste C providing lower contact resistance than paste A when both are fired.

Another aspect of the invention is a process of forming a front-side solar cell contact a silicon wafer having a p-type region, an n-type region, a p-n junction and an ARC layer on the front-side of the silicon wafer, comprising applying an ARC layer to the front-side of the silicon wafer, printing a paste A having fire-through capability on the ARC layer, wherein the paste A is printed as a plurality of continuous thin parallel finger lines to form a bottom print of continuous finger lines, printing a paste B over paste A, wherein the paste B is printed in a grid pattern comprising at least two busbars intersecting the bottom print of split finger lines at right angles and interposed in the gaps therein, and thin parallel finger lines forming a top print of finger lines superimposing the bottom print of finger lines, wherein the total printed area of pastes A and B is less than 10% of the area of the front-side, and firing the double-printed silicon wafer, wherein the paste A comprises an organic vehicle and an inorganic portion comprising (a1) at least one electrically conductive metal powder and (a2) glass frit, the paste A providing lower contact resistance than paste B, when both are fired, wherein the paste B comprises an organic vehicle and an inorganic content comprising (b1) at least one electrically conductive metal powder and (b2) glass frit, the paste B providing, during firing, better solder wetting and adhesion to silicon than paste A when both are fired.

Another aspect of the invention is a process of forming a front-side solar cell contact a silicon wafer having a p-type region, an n-type region, a p-n junction and an ARC layer on the front-side of the silicon wafer, comprising applying an ARC layer to the front-side of the silicon wafer, printing a first paste A having fire-through capability on the ARC layer, wherein the paste A is printed as a plurality of continuous thin parallel finger lines to form a bottom print of continuous finger lines, printing a second paste A or B or C over paste A, wherein the second paste is printed in a grid pattern comprising continuous thin parallel finger lines forming a top print of finger lines superimposing the bottom print of finger lines, leaving gaps therein, printing a third paste B over the first and second pastes wherein the third paste is printed as at least two busbars intersecting the bottom print of split finger lines at right angles and interposed in the gaps therein, wherein the total printed area of the first, second and third pastes is less than 10% of the area of the front-side, and firing the triple-printed silicon wafer, wherein the paste A comprises an organic vehicle and an inorganic portion comprising (a1) at least one electrically conductive metal powder and (a2) glass frit, the paste A providing lower contact resistance than paste B, when both are fired, wherein the paste B comprises an organic vehicle and an inorganic content comprising (b1) at least one electrically conductive metal powder and (b2) glass frit, the paste B providing, during firing, better solder wetting and adhesion to silicon than paste A when both are fired, wherein the paste C comprises an organic vehicle and an inorganic content comprising (c1) at least one electrically conductive metal powder and (c2) glass frit, the paste B providing lower contact resistance than paste A when both are fired.

Another aspect of the invention is a process of forming a front-side contact on a silicon wafer having a p-type region, an n-type region, a p-n junction and an ARC layer on the front-side of the silicon wafer, comprising printing a first paste A having fire-through capability on the ARC layer, wherein the paste A is printed in a grid pattern comprising thin parallel finger lines forming a bottom print of finger lines and at least two parallel busbars intersecting the finger lines at right angles, and printing and drying a second paste A, B, or C over the first paste wherein the second paste is printed in a grid pattern comprising continuous thin parallel finger lines forming a top print of finger lines superimposing the bottom print of finger lines and firing the double-printed silicon wafer, wherein the paste A comprises an a hot-melt adhesive and an inorganic portion comprising (a1) at least one electrically conductive metal powder and (a2) glass frit, the paste A providing, during firing, better solder wetting and adhesion to silicon than paste B, when both are fired, and wherein the paste B comprises an organic vehicle and an inorganic content comprising (b1) at least one electrically conductive metal powder and (b2) glass frit, the the paste B providing lower contact resistance than paste A, when both are fired.

Another aspect of the invention is a process of forming a front-side solar cell contact a silicon wafer having a p-type region, an n-type region, a p-n junction and an ARC layer on the front-side of the silicon wafer, comprising applying an ARC layer to the front-side of the silicon wafer, printing a first paste A having fire-through capability on the ARC layer, wherein the paste A is printed in a grid pattern comprising thin parallel finger lines forming a bottom print of finger lines and at least two parallel busbars intersecting the finger lines at right angles, and printing a second paste A or B or C over the first paste, wherein the second paste is printed in a grid pattern comprising thin parallel finger lines superimposing the bottom print of finger lines and at least two parallel busbars intersecting the finger lines at right angles, and wherein the total printed area of the first, second and third pastes is less than 10% of the area of the front-side, and firing the double-printed silicon wafer, wherein the paste A comprises an organic vehicle and an inorganic portion comprising (a1) at least one electrically conductive metal powder and (a2) glass frit, the paste A providing lower contact resistance than paste B, when both are fired, wherein the paste B comprises an organic vehicle and an inorganic content comprising (b1) at least one electrically conductive metal powder and (b2) glass frit, the paste B providing, during firing, better solder wetting and adhesion to silicon than paste A when both are fired, wherein the paste C comprises an organic vehicle and an inorganic content comprising (c1) at least one electrically conductive metal powder and (c2) glass frit, the paste B providing lower contact resistance than paste A when both are fired.

Another aspect of the invention is a process of forming a front-side contact on a silicon wafer having a p-type region, an n-type region, a p-n junction and an ARC layer on the front-side of the silicon wafer, comprising printing and drying a paste B having fire-through capability through a stencil between the at least two parallel busbars, wherein the paste B is printed in a grid pattern comprising thin parallel finger lines connecting the at least two parallel busbars, printing a paste A having fire-through capability on the ARC layer through a stencil, wherein the paste A is printed in a pattern comprising at least two parallel busbars, and firing the double-printed silicon wafer, wherein the paste A comprises an a hot-melt adhesive and an inorganic portion comprising (a1) at least one electrically conductive metal powder and (a2) glass frit, the paste A providing lower contact resistance than paste B, when both are fired, wherein the paste B comprises an organic vehicle and an inorganic content comprising (b1) at least one electrically conductive metal powder and (b2) glass frit, the paste B providing, during firing, better solder wetting and adhesion to silicon than paste A, when both are fired.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

10: p-type silicon substrate;
    20: n-type diffusion layer;
    30: front side passivation layer/anti-reflective coating;
    40: p+ layer (back surface field (BSF));
    70: first paste formed on backside;
    71: back electrode formed by firing first paste 70;
    80: second paste formed on backside;
    81: back electrode formed by firing second paste 80;
    500: front side silver/metal additive; and
    501: silver/metal additive front electrode after firing paste 500 through ARC.

Figure 2:
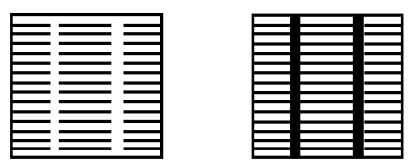
Figure 2:
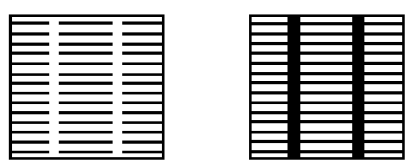
Figure 3:
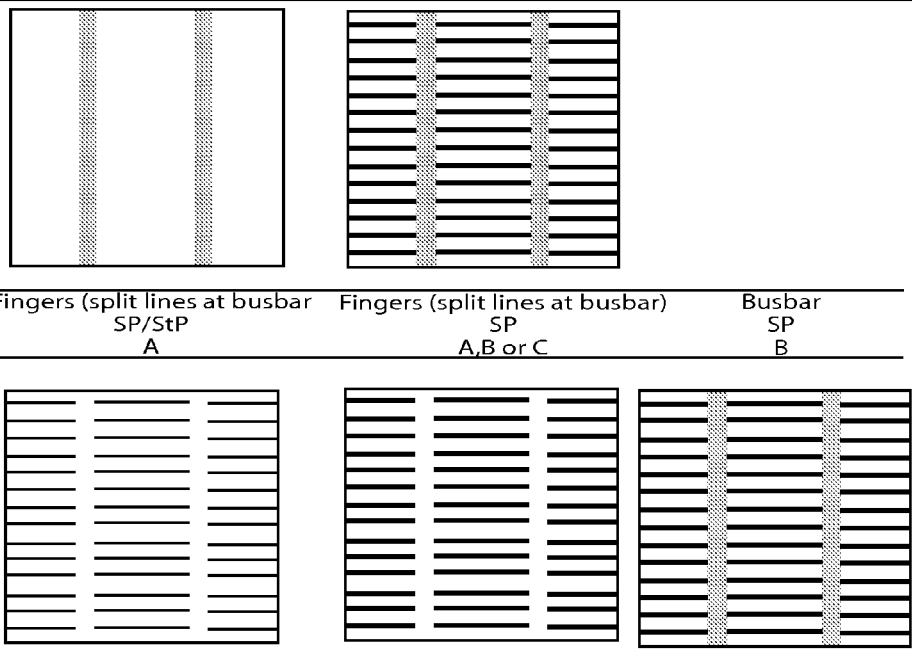
Figure 5:
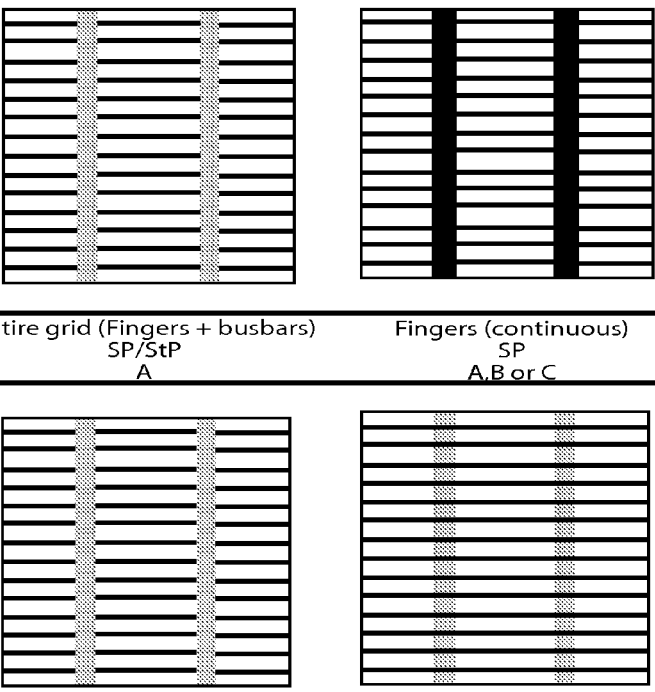
Figure 6:
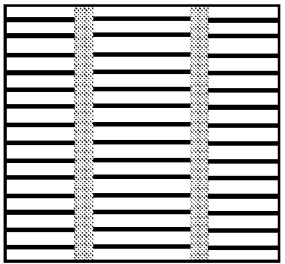
Figure 6:
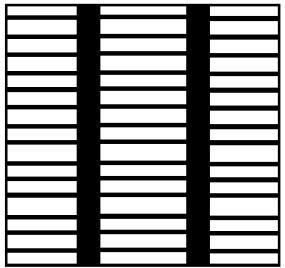
Figure 7:
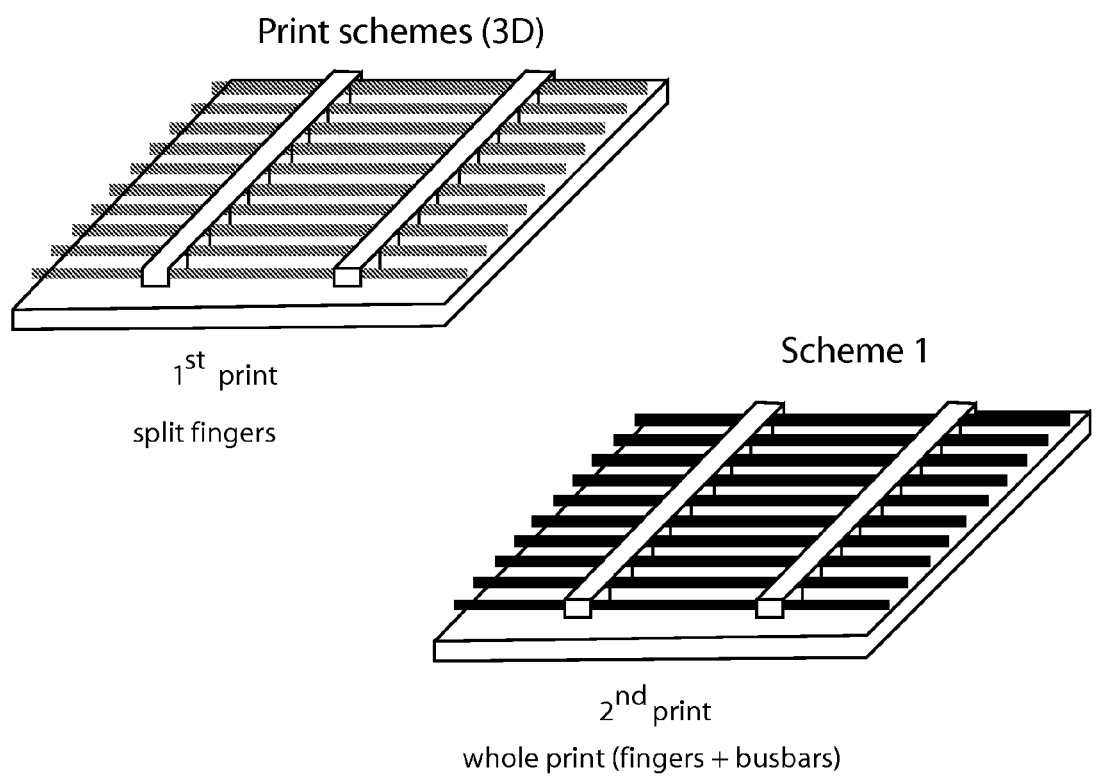
Figure 8:
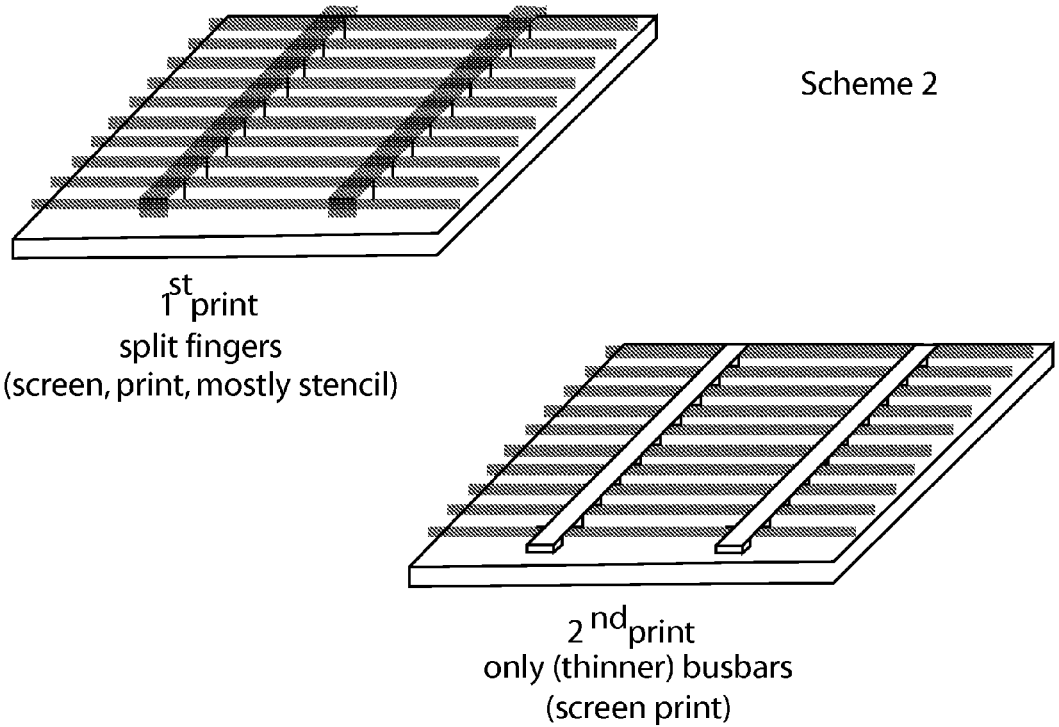
Figure 9:
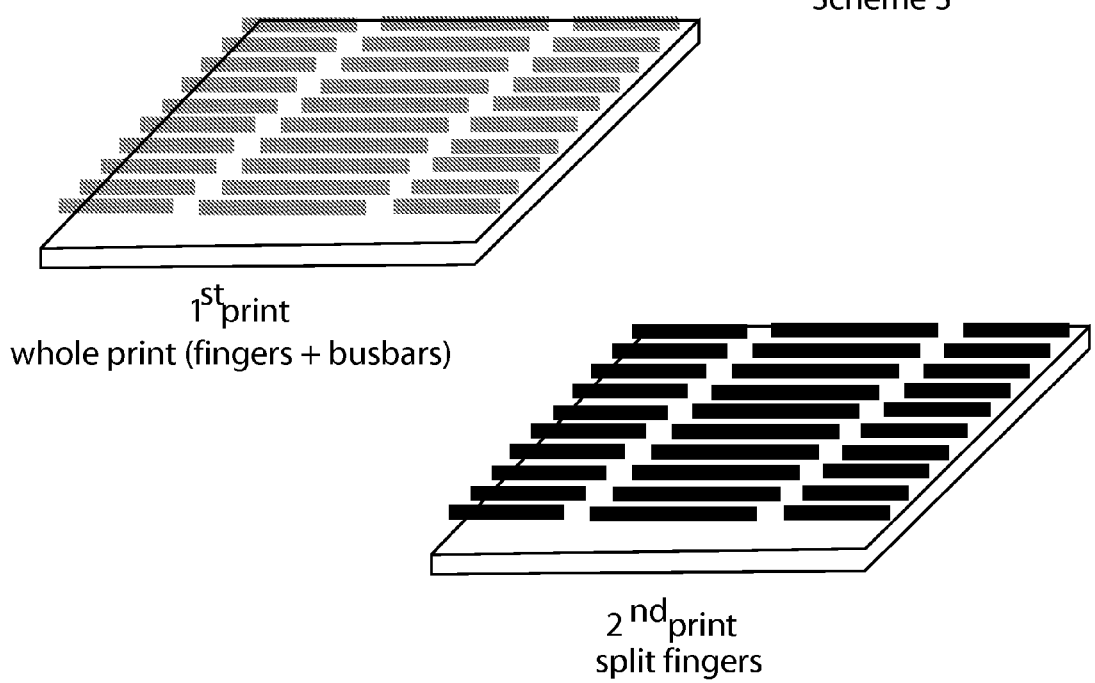

FIG. 2 is a top view of a solar cell substrate according to an exemplary embodiment of the invention;

FIG. 3 is a top view of a solar cell substrate according to an exemplary embodiment of the invention;

FIG. 4 is a top view of a solar cell substrate according to an exemplary embodiment of the invention;

FIG. 5 is a top view of a solar cell substrate according to an exemplary embodiment of the invention;

FIG. 6 is a top view of a solar cell substrate according to an exemplary embodiment of the invention;

FIG. 7 is a perspective top view of the solar cell substrate illustrated in the top portion of FIG. 2;

FIG. 8 is a perspective top view of the solar cell substrate illustrated in the bottom portion of FIG. 2; and FIG. 9 is a perspective top view of the solar cell substrate illustrated in the top portion of FIG. 3.

DETAILED DESCRIPTION

One of the potential methods to attain cost-effective photovoltaic products that reach the grid parity for photovoltaic energy conversion is to utilize reliable, highly efficient and cost-effective solar cells. The technology determining the PV market today with market share of about 80% is double side-contacted c-Si solar cells, which have proven to be robust and versatile. It is estimated that about 40% of the total of such solar cell processing cost is due to the use of expensive contact pastes, particularly silver-containing pastes. The inventors have discovered that an alternative to reducing silver content while maintaining the performance of a silver solar cell is to design cells using certain base metals, while maintaining low contact resistance similar to silver pastes.

Loss or degradation of electrical properties in c-Si solar cells having silver electrodes is primarily due to high ohmic loss, that is, high contact resistance between silver and the silicon substrate. Significant efforts have been made on improving contact resistance such as by changing or modifying glass frit compositions, metal powder morphologies and co-firing set profiles however with a certain level of success, for example; formation of thick insulating layers is a limiting factor at the front electrode of conventional cells.

Considerable efforts have been made to develop base metal contacts but with limited success as they required the great practical inconvenience and expense of firing in non-oxidizing atmosphere (nitrogen, argon, nitrogen/hydrogen, etc.). There is a distinct commercial need for less expensive conductor compositions which can be fired in air to produce low contact resistance with Si surface, including conventional pattern as well as new cell architectures. Therefore, through diligent studies, the inventors have developed new conductor pastes providing low ohmic loss using base metal materials compatible to industrial-level production processes; for example fast air firing, for the cost effective solar devices.

New double printing schemes are shown in FIGS. 2-9.

The inventors herein have discovered that air fired base metal paste compositions comprising NiB, NiSi, NiP or their mixtures together with silver produce results equal to or superior than standard silver pastes. Such have been developed and tested for contact resistance on silicon using Transmission Line Method (TLM).

The inventive methods have the following steps: (a) NiB is reduced to powder having an average particle size of 2-5 µm; (b) Paste (including organic vehicle and solvent) is made based on 70-95% solids without the use of glass frit. The resultant layer sintered well; (c) this paste composition can be used on n+-surface Si wafer comprising: (i) P-type wafer cell: Front electrode; (ii) N-type wafer cells: Back electrode; (iii) PMWT: Front/Back electrode and plug; (iv) N-type: Front electrode (v) EWT: plugs electrode or (vi) p-PERC: Front electrodes.

The solar cells of the invention include several major constituents: silicon, metal pastes including metals such as silver, nickel, copper, palladium, platinum, glass, an organic vehicle, additive metal oxides, dopants, additives such as adhesion promoters, leveling agents, and hot melt adhesives. Further additives such as adhesion promoters, leveling agents, and hot melt adhesives are also employed in various embodiments of the invention.

The method of applying the paste on such substrates is selected from the group consisting of screen printing, ink jet printing, pad printing, stencil printing, hotmelt ink printing (using a hot melt paste) and microspray. At present the preferred method is screen printing.

The paste compositions can be used as film pastes to make, for example, front contacts for silicon-based solar cells which collect current generated by exposure to light, or to make back contacts that conduct electrons to an outside load. Cell electrical performance as measured by cell efficiency ($\eta$) and fill factor (FF) is affected by the microstructure and the electrical properties of the silver/silicon interface. The electrical properties of the solar cell are also characterized by series resistance (Rs) and shunt resistance (Rsh). The composition and microstructure of the front contact interface largely determine Rs. The subject paste compositions can provide low series resistance (Rs) and high shunt resistance (Rsh) to give high performance solar cells, as measured by efficiency ($\eta$) and fill factor (FF).

The paste compositions and methods of the invention can facilitate optimized interaction, bonding, and contact formation between front contact components, typically Ni and Si, through the glass medium. The paste composition can be printed on a silicon substrate, and fired to fuse the glass and sinter the metal therein. Upon firing, Ni/Si conductive islands are formed providing conductive bridges between bulk paste and silicon wafer. When leaded glasses are used, the leaded glasses allow low firing temperatures owing to their excellent flow characteristics relatively at low temperatures.

The paste can be applied on a substrate by any suitable technique. In one embodiment, the paste is applied by screen-printing, stencil printing, extrusion, pad printing, ink jet printing, hot melt printing, or any suitable micro-deposition direct writing techniques that one of ordinary skill in the art would recognize. The paste composition can be used to from contacts of a solar cell. The pastes are screen-printed on a substrate and the pastes formed on the substrate are fired to relatively low temperatures (550° C. to 850° C. wafer temperature; furnace set temperatures of 650° C. to 1000° C.) to form a low resistance contact between, for example, the N-side of a phosphorus doped silicon wafer and the paste composition.

Metal Component. Solar cell contacts typically include silver, aluminum, a silver source or an aluminum source of combinations of the foregoing. A feature of the invention is the reduction in silver consumption in production of solar cell front contacts while maintaining similar or superior electrical properties relative to traditional high-silver contacts. Accordingly, for any amount of silver noted in this paragraph, other metals such as nickel, copper, palladium, and platinum can be substituted. The silver metal component may come in any suitable form, including silver metal powder, an alloy of silver, a silver salt, and organometallic silver, an oxide of silver, and a silver-containing glass. The silver particles used in the paste may be particles such as flakes, spherical particles, irregularly shaped particles, nano-sized particles, an agglomeration of particles, or provided in a suspension such as a colloidal suspension, or a particle free solution, and combinations of the foregoing. Flakes are preferred. Combinations of the foregoing may be used. In formulating the pastes, the metal powders typically have particle sizes of about 0.1 to about 40 microns, preferably less than 10 microns. For example the paste may comprise about 80 to about 99 wt % spherical silver particles or alternatively about 70 to about 90 wt % silver particles and about 1 to about 10 wt % silver flakes. Given proportions of silver particles can be replaced with nodular silver. Alternatively the paste may comprise about 75 to about 90 wt % silver flakes and about 1 to about 10 wt % of colloidal silver, or about 60 to about 95 wt % of silver powder or silver flakes and about 0.1 to about 20 wt % of colloidal silver.

Additives. Metal Oxides. The additives of interest herein provide at least one oxide of a metal selected from the group consisting of Ag, Al, Ba, Bi, Ca, Co, Cr, Cu, Fe, K, Li, Mg, Mn, Mo, Na, Nd, Ni, Sb, Si, Sn, Sr, Ta, V, Zn, Zr, and combinations thereof. Useful oxides herein include $KO_2$, $P_2O_5$, $MnO_2$, $K_2O$, $V_2O_5$, $Sb_2O_3$, $Ni_2O_3$, $Fe_2O_3$, $B_2O_3$, $GeO_2$, $CuO$, $Fe_3O_4$, $Mn_2O_3$, $MoO_2$, $CoO$, $Co_3O_4$, $Mo_2O_3$, $SnO_2$, $PbO_2$, $Cr_2O_3$, $GeO$, $Ga_2O_3$, $SiO_2$, $V_2O_3$, $Na_2O$, $In_2O_3$, $Sb_2O_5$, $ZnO$, $WO_2$, $Bi_2O_3$, $NiO$, $Pb_3O_4$, $Ag_2O$, $MnO$, $SnO$, $TiO_2$, $VO$, $Ta_2O_5$, $PbO$, $ZrO_2$, $Al_2O_3$ and their combinations. Any oxide of the metals in this paragraph or other compositions that ultimately provide such oxides are envisioned herein.

The organometallic compounds useful herein in addition to the foregoing include organovanadium compounds, organoantimony compounds, and organo-yttrium compounds. The organometallic compound is a compound where metal is bound to an organic moiety. For example, the organometallic compound is an organic compound containing metal, carbon, and/or nitrogen in the molecule. Further, in addition to the foregoing metal compounds, a second metal additive selected from the group consisting of an organocobalt compound, an organotin compound, an organozirconium compound, an organozinc compound and an organolithium compound may be included in the paste compostion to form a nickel intermetallic compound in situ. In one embodiment, the organometallic compound may be fully dissolved in the organic vehicle such that no metallic particles are present. The organometallic compounds in this paragraph may be present in the paste in an amount of 0.01-50 wt % or preferably 0.05-30 wt %, alternately 0.01-5 wt %.

The organometallic compound can include any suitable organic moieties such as those that are C1-C50 linear or branched, saturated or unsaturated, aliphatic, alicyclic, aromatic, araliphatic, halogenated or otherwise substituted, optionally having one or more heteroatoms such as O, N, S, or Si, and/or including hydrocarbon moieties such as alkyl, alkyloxy, alkylthio, or alkylsilyl moieties.

Specific examples of organometallic compounds include metal alkoxides. The metal can be boron, silicon, vanadium, antimony, phosphorous, yttrium, or combinations thereof. It is understood that some authorities consider boron and silicon be metalloids, while phosphorus is a non-metal. For the purposes of this document, and without any intention to attribute foreign properties to them, the term "organometallic" may at times be used to include organoboron compounds, organosilicon compounds and organophosphorus compounds. The alkoxide moiety can have a branched or unbranched alkyl group of, for example, 1 to 20 carbon atoms. The respective alkoxides envisioned herein include, nickel alkoxides, boron alkoxides, phosphorus alkoxides, silicon alkoxides, vanadium alkoxides, vanadyl alkoxides, antimony alkoxides, yttrium alkoxidesm, cobaltic alkoxides, cobaltous alkoxides, stannic alkoxides, stannous alkoxides, zirconium alkoxides, zinc alkoxides and lithum alkoxides.

Examples of boron alkoxides include boron methoxide, boron ethoxide, boron propoxide, and boron butoxide. Analogous examples can be envisioned for nickel alkoxides, phosphorus alkoxides, antimony alkoxides, yttrium alkoxides, cobaltic alkoxides, cobaltous alkoxides, nickel alkoxides, zirconium alkoxides, tin alkoxides, zinc alkoxides and lithium alkoxides can be used.

Other examples of organo-metal compounds include metal acetylacetonates, where the metal can be nickel, boron, phosphorus, vanadium, antimony, yttrium, or combinations thereof. Examples of organo-vanadium compounds include nickel acetylacetonates such as Ni(AcAc)3 (also called nickel (III) 2,4-pentanedionate) where (AcAc) is an acetyl acetonate (also called 2,4-pentanedionate).

In the same way, vanadium acetylacetonate, antimony acetylacetonate, zinc acetylacetonate, yttrium acetylacetonate, cobaltic acetylacetonate, cobaltous acetylacetonate, nickel acetylacetonate, zirconium acetylacetonate, dibutyltin acetylacetonate, zinc acetylacetonate, lithium acetylacetonate, manganese acetylacetonate, cuprous acetylacetonate, cupric acetylacetonate, ruthenium acetylacetonate, rhodium acetylacetonate, ferric acetylacetonate, and ferrous acetylacetonate can be used. For example, antimony 2,4-pentanedionate, yttrium 2,4-pentanedionate, or combinations thereof can be used.

The metal acetylacetonates may be present in the pastes of the invention in an amount of 0.01-10 wt % wherein the metal of the metal acetylacetonate is selected from the group consisting of V, Zn, Mn, Co, Ni, Cu, Y, Zr, Ce, Ru, Rh, and Fe.

Yet other examples of organo-metal compounds include metal 2-methylhexanoates, metal 2-ethylhexanoates, and metal 2-propylhexanoates. Specific examples include boron 2-methylhexanoate, phosphorus 2-methylhexanoate, silicon 2-methylhexanoate, vanadium 2-methylhexanoate, antimony 2-methylhexanoate, yttrium 2-methylhexanoate, cobalt 2-methylhexanoate, nickel 2-methylhexanoate, zirconium 2-methylhexanoate, tin 2-methylhexanoate, zinc 2-methylhexanoate lithium 2-methylhexanoate, boron 2-ethylhexanoate, phosphorus 2-ethylhexanoate, silicon 2-ethylhexanoate, vanadium 2-ethylhexanoate, antimony 2-ethylhexanoate, yttrium 2-ethylhexanoate, cobalt 2-ethylhexanoate, nickel 2-ethylhexanoate, zirconium 2-ethylhexanoate, tin 2-ethylhexanoate, zinc 2-ethylhexanoate, lithium 2-ethylhexanoate, vanadium 2-propylhexanoate, boron 2-propylhexanoate, phosphorus 2-propylhexanoate, silicon 2-propylhexanoate, antimony 2-propylhexanoate, yttrium 2-propylhexanoate, cobalt 2-propylhexanoate, nickel 2-propylhexanoate, zirconium 2-propylhexanoate, tin 2-propylhexanoate, zinc 2-propylhexanoate and lithium 2-propylhexanoate.

Yet other examples of organo-metal compounds include metal acrylate and metal methacrylate, where the metal can be nickel, boron, phosphorus, vanadium, antimony, yttrium, cobalt, nickel, zirconium, tin, zinc or lithium. Acids including boron can be used also to introduce boron into the intermetallic, for example boric acid, H3BO3; 2-acetamidopyridine-5-boronic acid, 5-acetyl-2,2-dimethyl-1,3-dioxane-dione; 2-acetylphenylboronic acid; 3-acetylphenylboronic acid; 4-acetylphenylboronic acid; 3-aminocarbonylphenylboronic acid; 4-aminocarbonylphenylboronic acid, 3-amino-4-fluorophenylboronic acid; 4-amino-3-fluorophenylboronic acid, and others commercially available from Boron Molecular, Research Triangle, NC.

The pastes may include 0.001-10 wt %, preferably 0.01-5 wt % of an organometallic compound from the preceding paragraph, for example, an organo-lithium such as lithium acrylate and lithium methacrylate.

The paste composition, when the nickel intermetallic compound is formed in situ, contains the organometallic compound(s) in a suitable amount. In one embodiment, the paste composition contains the organometallic compounds in an amount of 60-95 wt %, preferably 65-90 wt %, more preferably 70-85 wt %.

The metal additive can be in any suitable form, for example, particles such as flakes, spherical, irregular shaped, flaked, nano-sized, an agglomeration of particles, or provided in a suspension such as a colloidal suspension, or a particle free solution, and combinations of the foregoing. Flakes are preferred. When the metal additive is in the form of particle, the metal additive particles can have any suitable size. In one embodiment, the metal additive particles have a median D50 particle size of about 0.05 microns or more and about 50 microns or less. In another embodiment, the metal additive particles have a median particle size of about 0.05 to 10 microns or about 0.05 to 5 microns.

The intermetallic compound particles can have any suitable size. In one embodiment, the intermetallic particles have a D50 particle size of about 0.05 to about 10 microns. Preferably, the intermetallic particles have a D50 size of 1-8 microns, more preferably 2-5 microns. In another embodiment, the intermetallic particles have a median particle size of about 1 to 9 microns, preferably 2-8 microns more preferably 3-7 microns. Particle size is measured using a Honeywell Microtrac X100 instrument.

The nickel intermetallic compound is present in the paste in an amount of 65-95 wt %, preferably 70-90 wt %; more preferably 75-85 wt %; still more preferably 78-82 wt %.

GLASS FRIT. The glass frits used herein are not critical and the paste composition can contain any suitable glass fits. As an initial matter, the glass frits used in the pastes herein can intentionally contain lead and/or cadmium, or they can be devoid of intentionally added lead and/or cadmium. In one embodiment, the glass frit is a substantially lead-free glass frit. In another embodiment all of the glass fits are lead and cadmium free. The glasses can be partially crystallizing or non-crystallizing. Partially crystallizing glasses are preferred. Mixture of glass fits with one or more crystallizing or partially crystallizing or non-crystallizing structures can be used. The details of the composition and manufacture of the glass frits can be found in, for example, commonly-assigned U.S. Patent Application Publication Nos. 2006/0289055 and 2007/0215202, and Provisional Specification 61/407,588 which are hereby incorporated by reference.

Although generally avoided, substantial additions of thallium oxide or vanadium oxides can be added to these frits to attain lower firing temperatures. Similarly substantial amounts of tellurium oxide or germanium oxide can be added to these fits to attain lower flow temperatures.

The paste composition can include any suitable glass frit. A paste can also exclude glass frit entirely. The following tables set forth glass frit compositions useful in the practice of the invention. An entry such as Sb2O5+V2O5 means that Sb2O5 or V2O5 or a combination of the two is present in the specified amount.

TABLE 2

Oxide glass frit composition in weight percent of total glass.

| Constituent | Glass Composition I |
|---|---|
| PbO | 52-88 |
| $SiO_2$ | 0.5-15 |
| $Al_2O_3$ | 0.5-10 |
| ZnO | 0-22 |
| $Ta_2O_5$ | 0-8 |
| $ZrO_2$ | 0-10 |
| $P_2O_5$ | 0-8 |
| $Li_2O + K_2O + Na_2O$ | 0-15 |
| $B_2O_3$ | 0-12 |
| $Fe_2O_3 + Co_2O_3 + CuO + MnO_2$ | 0-25 |

TABLE 3

Lead free bismuth glass frit composition in weight percent of total glass.

| Constituent | Glass Composition II |
|---|---|
| $Bi_2O_3$ | 55-90 |
| $B_2O_3$ | 1-15 |
| $SiO_2$ | 0-20 |
| ZnO | 0-13 |
| $K_2O$ | 0-12 |
| $LiO_2$ | 0-12 |
| $Na_2O$ | 0-12 |
| $Nb_2O_5 + Ta_2O_5$ | 0-10 |
| $Fe_2O_3 + Co_2O_3 + CuO + MnO_2$ | 0-25 |

TABLE 4

Lead free and bismuth free glass frit composition in weight percent of total glass.

| Constituent | Glass Composition III |
|---|---|
| $B_2O_3 + SiO_2$ | 30-62 |
| ZnO | 0-34 |
| $TiO_2$ | 0-22 |
| $LiO_2$ | 0-10 |
| $Na_2O$ | 0-23 |
| $K_2O$ | 0-13 |
| $P_2O_5$ | 0-10 |
| $Sb_2O_5 + V_2O_5$ | 0-13 |
| $ZrO_2$ | 0-8 |
| F | 0-5 |
| $Fe_2O_3 + Co_2O_3 + CuO + MnO_2$ | 0-25 |

TABLE 5

Lead vanadium phosphorus glass frit composition in weight percent of total glass

| Constituent | Glass Composition | | | |
|---|---|---|---|---|
| | IV | V | VI | VII |
| PbO | 10-60 | | 10-60 | |
| PbO + ZnO + BaO + CaO + SrO | | 5-70 | | 5-70 |
| $V_2O_5$ | 30-70 | 30-70 | | |
| $P_2O_5$ | 5-30 | 5-30 | | |
| $V_2O_5 + P_2O_5 + Ta_2O_5 + Nb_2O_5 + Sb_2O_5$ | | | 5-80 | 5-80 |
| $Fe_2O_3 + Co_2O_3 + CuO + MnO_2$ | 0-25 | | 0-25 | |
| $TeO_2 + GeO_2 + TlO_2$ | | 0-70 | | 0-70 |

Although in these tables the oxides are denoted by the chemical formula of one of their valence states such as $Fe_2O_3$, the oxides of other valence states such as FeO or $Fe_3O_4$ are also implied by these formulae.

The frits can contain other oxides such as $MoO_3$, $WO_3$, $In_2O_3$, and/or $Ga_2O_3$ to adjust wetting and flow properties.

In various embodiments of the invention, the glass component may include at least one Pb-containing glass frit having a softening point of 300 to 550° C. Broadly, the frits may be non-crystallizing glass, partially crystallizing glass, crystallizing glass and combinations thereof. In one embodiment, the glass component or frit may include an oxide of a transition metal selected from the group of Mn, Fe, Co, Ni, Cu, Ti, V, Cr, W, Nb, Ta, Hf, Rh, Ru, Pd, Pt, and combinations thereof to achieve lower contact resistance and a wider firing window. A wider firing window means that the paste containing the glass frit may be effectively fired at a higher or lower temperature than would be possible without the presence of the above-named transition metal oxide(s) to an extent of ±25° C., ±50° C., ±75° C., or ±100° C., relative to the normal firing temperature required to effectively sinter the metal and fuse the glass in the paste.

The paste composition can contain any suitable amount of the glass frit. In one embodiment, the paste composition includes about 1-15 wt % of the glass frit, preferably 2-12 wt %, more preferably 2-10 wt % more preferably 2-8 wt % and more preferably 3-6 wt %.

Inorganic/Other Additives. The paste composition can optionally contain any other additives. In one embodiment, phosphorus is added to the paste composition in a variety of ways to reduce the resistance of the front contacts. For example, certain glasses can be modified with $P_2O_5$ in the form of a powdered or fitted oxide, or phosphorus can be added to the paste by way of phosphate esters and other organo-phosphorus compounds. More simply, when the silver and/or metal additives are in the form of particles, phosphorus can be added as a coating to silver and/or metal additive particles prior to making a paste. In such case, prior to pasting, the silver and/or metal additive particles are mixed with liquid phosphorus and a solvent. For example, a blend of about 85 to about 95 wt % silver and/or metal additive particles, about 5 to about 15 wt % solvent, and about 0.1 to about 10 wt % liquid phosphorus is mixed and the solvent evaporated. Phosphorus coated silver and/or metal additive particles help ensure intimate mixing of phosphorus and silver and/or metal additive in the pastes.

Other additives such as fine silicon or carbon powder, or both, can be added to the paste to control the silver reduction and precipitation reaction. The silver precipitation at the interface or in the bulk glass can also be controlled by adjusting the firing atmosphere (e.g., firing in flowing $N_2$ or $N_2/H_2/H_2O$ mixtures). However, no special atmosphere is required. Fine low melting metal additives (e.g., elemental metallic additives as distinct from metal oxides) such as Pb, Bi, In, Ga, Sn, Ni, and Zn or alloys of each with at least one other metal can be added to provide a contact at a lower firing temperature, or to widen the firing window. Typically such metal additions are present at a rate of less than about 1 wt % of the conductive metal portion of the pastes herein. Organometallic compounds providing aluminum, barium, bismuth, magnesium, zinc, strontium, lithium and/or potassium can be used, such as, for example, the acetates, acrylates, methacrylates, formates, neodeconates, methoxides, ethoxides, methoxyethoxides, and stearates of the named metals. Potassium silicate is also a suitable source of potassium.

A mixture of (a) glasses or a mixture of (b) glasses and crystalline additives or a mixture of (c) one or more crystalline additives can be used to formulate a glass component in the desired compositional range. The goal is to reduce the contact resistance and improve the solar cell electrical performance. For example, crystalline materials such as $Bi_2O_3$, $Sb_2O_3$, $Sb_2O_5$, $In_2O_3$, $Ga_2O_3$, SnO, MgO, ZnO, $Cr_2O_3$, $Fe_2O_3$, $Pb_3O_4$, PbO, $SiO_2$, $ZrO_2$, $V_2O_5$, $Al_2O_3$, $B_2O_3$, $TiO_2$, $Nb_2O_5$, $Ta_2O_5$, $Tl_2O$, $TeO_2$ and $GeO_2$ can be added to the glass component to adjust contact properties. The foregoing oxides can be added in glassy (i.e., non-crystalline) form as well. Combinations and reaction products of the aforementioned oxides can also be suitable to design a glass component with desired characteristics. For example, low melting lead silicates, either crystalline or glassy, formed by the reaction of PbO and $SiO_2$ such as $4PbO.SiO_2$, $3PbO.SiO_2$, $2PbO.SiO_2$, $3PbO.2SiO_2$, and $PbO.SiO_2$, either singly or in mixtures can be used to formulate a glass component. Other reaction products of the aforementioned oxides such as, Bismuth silicates such as $Bi_2O_3.SiO_2$, $3Bi_2O_3.5SiO_2$, zinc silicates such as $2ZnO.SiO_2$ and $ZrO_2.SiO_2$ can also be used. Similarly niobates such as bismuth niobates, titanates such as bismuth titanates can be used. Further mineral forms of these oxides such willemite and zircon can also be added in place of reaction products. However, the total amounts of the above oxides will fall within the ranges specified for various embodiments disclosed elsewhere herein.

It is also envisioned that pigmentary reaction products of these oxides such as cobalt aluminate, cobalt silicates, black pigments such as copper iron manganese oxides can also be used as other crystalline additives.

One exemplary paste compositions includes 65-95 wt % of the nickel intermetallic compound and further comprises 1-10% of an organic vehicle, 1-10 wt % of at least one solvent, and 1-10 wt % of glass. Another exemplary paste composition includes 70-90 wt % of the nickel intermetallic compound and further comprises 1-10% of an organic vehicle, 1-10 wt % of at least one solvent, and 1-10 wt % of glass.

Dopants. Any paste herein may include an n-type dopant or a p-type dopant. Suitable dopants include, for example, $Li_2O$, phosphorus coated silver, phosphoroesters, phosphorus, boron, gallium, arsenic, antimony, and combinations thereof.

Organic Vehicle. The paste composition can contain any suitable vehicle (e.g., carrier). The organic vehicle or carrier for most conductive compositions is typically a solution of a resin dissolved in a solvent. In one embodiment, the vehicle further contains a thixotropic agent. The solvent usually boils from about 130° C. to about 350° C. In one embodiment, the resin is ethyl cellulose. Other examples of resins include ethyl hydroxyethyl cellulose, wood rosin, gum rosin, mixtures of ethyl cellulose and phenolic resins, polymethacrylates of lower alcohols, and the monobutyl ether of ethylene glycol monoacetate. The pastes of the invention include from about 10-20 wt % of organics, including 3-6 wt % of a vehicle, 2-4 wt % of solvents, and 3-5 wt % of plasticizers.

Examples of solvents include terpenes such as alpha- or beta-terpineol or higher boiling alcohols such as Dowanol® (diethylene glycol monoethyl ether), or mixtures thereof with other solvents such as butyl Carbitol® (diethylene glycol monobutyl ether); dibutyl Carbitol® (diethylene glycol dibutyl ether), butyl Carbitol® acetate (diethylene glycol monobutyl ether acetate), hexylene glycol, Texanol® (2,2,4-trimethyl-1,3-pentanediol monoisobutyrate), as well as other alcohol esters, kerosene, and dibutyl phthalate.

Plasticizers such as Santicizer® brand from Ferro Corporation are suitable.

In one embodiment, the organic vehicle contains organometallic compounds, for example those based on phosphorus or silver, to modify the contact. Various combinations of these and other solvents can be formulated to obtain the desired viscosity and volatility requirements for each application. Other dispersants, surfactants and rheology modifiers can be included.

Products useful in the organic carrier can be obtained commercially under any of the following trademarks: Texanol® (Eastman Chemical Company, Kingsport, Tenn.); Dowanol® and Carbitol® (Dow Chemical Co., Midland, Mich.); Triton® (Union Carbide Division of Dow Chemical Co., Midland, Mich.), Thixatrol® (Elementis Company, Hightstown N.J.), and Diffusol® (Transene Co. Inc., Danvers, Mass.), Ethyl Cellulose (Dow Chemical Company, Midland, Mich.), Terpineol, (Hercules Inc., Wilmington, Del.). N-Diffusol® is a stabilized liquid preparation containing an n-type diffusant with a diffusion coefficient similar to that of elemental phosphorus.

Hydrogenated castor oil and derivatives thereof can be used as organic thixotropic agents. A thixotrope is not always necessary because the solvent/resin properties coupled with the shear thinning inherent in any suspension can alone be suitable in this regard. Furthermore, wetting agents, can be employed such as fatty acid esters, e.g., N-tallow-1,3-diaminopropane di-oleate; N-tallow trimethylene diamine diacetate; N-coco trimethylene diamine, beta diamine; N-oleyl trimethylene diamine; N-tallow trimethylene diamine; and N-tallow trimethylene diamine dioleate, and combinations thereof.

It should be kept in mind that the foregoing compositional ranges are preferred and it is not the intention to be limited to these ranges where one of ordinary skill in the art would recognize, starting with the teachings herein, that these ranges may vary depending upon specific applications, specific components and conditions for processing and forming the end products.

Paste Preparation. The paste composition can be formed by combining silver, a glass frit, and a metal additive with an organic vehicle and dispersing the silver, the glass frit, and the metal additive in the organic vehicle. The amount and type of vehicle utilized can be determined by the final desired formulation viscosity, fineness of grind of the paste, and the desired wet print thickness. In preparing compositions according to the invention, the particulate inorganic solids are mixed with the organic vehicle and dispersed with suitable equipment, such as a three-roll mill, to form a suspension, resulting in a composition for which the viscosity will be in the range of about 50 to about 200 kcps, preferably about 55 to about 120 kcps, at a shear rate of 9.6 $sec^{-1}$ as determined on a Brookfield viscometer HBT, spindle CP-51, measured at 25° C.

Pastes A, B, and C will be referred to herein. Paste A is generally used for the bottom layer (printed directly on the silicon wafer). Paste A is formulated to form low contact resistance between bottom layer and Si. For example, paste A may include 0.01-10 wt % of at least one metal silicate, wherein the metal silicate has the formula: $MaSi_bO_{c+2b}$, wherein a=1, 2, or 3, b=1, 2, or 3, c=a/2, a, or 2a, and metal M is selected from the group of: Zn, Mg, Li, Mn, Co, Ni, Cu, Gd, Zr, Ce, Fe, Al, and Y.

In certain embodiments of the invention, paste A comprises (a) 50-95 wt % of a metal source comprising: (i) silver or a source of silver and (ii) at least one metal or source of a metal selected from the group consisting of nickel, copper, palladium, platinum, and combinations thereof, (b) 0.5-15 wt % of a glass component, and (c) 5-20 wt % of an organic vehicle. The metal source may comprise silver, or an alloy of silver, and at least one metal or source of a metal selected from the group consisting of nickel, copper, palladium, platinum, and combinations thereof. The metal source may be a powder provided in at least one form selected from the group consisting of spherical particles, irregularly shaped particles, flakes, nano-sized particles, an agglomeration of particles, suspensions, or mixtures thereof.

Paste B is typically used for the top layer, that is, printed over Paste A. Paste B is formulated to have several properties and characteristics, namely lower cost owing to a lower usage of silver; not capable of firing through an ARC layer; good solderability and adhesion strength. Preferably, glass frit is not capable of firing through ARC layer. The solid content of paste B is lower than that of paste A.

In certain embodiments of the invention, paste B comprises: (a) 40-85 wt % of a metal source, (b) 0.5-15 wt % of a glass component, and (c) 5-20 wt % of an organic vehicle.

Pastes B and C, in various embodiments, may include less than 80 wt % metal, preferably less than 75 wt % metal, more preferably less than 72 wt % and still more preferably less than 65 wt % metal. The metal source of pastes B or C may comprise silver, or an alloy of silver, and at least one metal selected from the group consisting of nickel, copper, palladium, and combinations thereof. The metal source of pastes B or C may be a powder having a particle shape selected from the group consisting of flakes, spherical particles, irregular shaped, nano-sized, an agglomeration of particles, or provided in a suspension, and combinations thereof.

In certain embodiments of the invention, the glass component of pastes A, B, or C may include at least one Pb-containing glass frit, or may include at least one glass frit is free of lead and cadmium. In one embodiment, the glass frit is not capable of firing through an antireflective coating. In further embodiments, the Tg of the glass component of paste B or paste C is not higher than the Tg of the glass component of paste A. This is to prevent the glass of paste B from penetrating into the glass from paste A. Pastes B and C may include an adhesion promoter or leveling agent, or both. A leveling agent leads to the top layer forming smooth final printed lines. In one embodiment, the total proportion of metal and glass in paste B is less than the total proportion in paste A. In another embodiment, the total proportion of metal and glass in paste C is less than the total proportion in paste A. In one embodiment, the glass component of paste B or paste C comprises at least one glass frit having a softening point of 300 to 550° C.

In another embodiment, paste A may include a hot melt adhesive. In such case, the process of forming the solar cell contact then includes drying paste B (or paste C) after printing over paste A. In another embodiment, pastes B or C may also include a hot melt adhesive. In such case, the process of forming the solar cell contact then includes drying paste A after printing paste A. According to another embodiment, any of pastes A, B or C may be dried after printing.

In yet other embodiments, the metal source of pastes A, B or C may include nickel, wherein the nickel is provided in the form of an organonickel compound. The organonickel compound may be selected from the group consisting of nickel acetyl acetonate and nickel 2-ethyl hexanoate. The $D_{50}$ particle size of the conductive metal powders in either paste A or B may be in the range of 0.05 to 10 microns. The metal source may be an organometallic compound that is fully dissolved in the organic vehicle and the organic vehicle is free of metal particles.

In another embodiment, the glass frit of the pastes may be selected from the group consisting of non-crystallizing glass, partially crystallizing glass, crystallizing glass and combinations thereof. The glass frit may include an oxide of a transition metal selected from the group of Mn, Fe, Co, Ni, Cu, Ti, V, Cr, W, Nb, Ta, Hf, Rh, Ru, Pd, Pt, and combinations thereof to achieve lower contact resistance and a wider firing window.

The pastes may further include 0.01-10 wt % of a metal acetyl acetonate, wherein the metal of the metal acetyl acetonate is selected from the group consisting of V, Sb, Y, Co, Ni, Zr, Sn, Zn, Li, Mn, Cu, Ce, Ru, Rh, and Fe. Specifically, paste A may further comprise 0.01-10 wt % of at least one metal silicate, wherein the metal silicate has the formula: $MaSibOc+2b$, wherein a=1, 2, or 3, b=1, 2, or 3, c=a/2, a, or 2a, and metal M is selected from the group of: Zn, Mg, Li, Mn, Co, Ni, Cu, Gd, Zr, Ce, Fe, Al and Y. Paste A may further comprise 0.01-5 wt % of an organo-lithium compound selected from the group consisting of lithium acrylate and lithium methacrylate. Paste A may also further comprise an organozinc compound. The organozinc compound may be present in the paste composition in an amount of 0.05 wt-30 wt %.

The pastes A and b may further comprise a dopant selected from the group consisting of an n-type dopant and a p-type dopant. The dopant may be selected from the group consisting of Li2O, phosphorus coated silver, phosphoroesters, phosphorus, boron, gallium, arsenic, antimony, and combinations thereof. Further, at least one pastes A and B may further comprise 0.01 to 5 wt % of an organolithium compound.

Any paste herein may be printed through a stencil. It is preferable that paste A is printed through a stencil; specifically in cases where finger lines are printed with paste A. Pastes B and C can be printed by screen printing; that is there is no particular advantage of using stencil for printing the busbars. The paste may be printed to a wet thickness of 10-100 microns, resulting in a dried thickness of 7-70 microns. Any paste herein may be screen printed through a screen having an opening of 80 microns or less, preferably 70 microns or less, more preferably 65 microns or less, more preferably 60 microns or less, more preferably 55 microns or less, and still more preferably 50 microns or less. According to one embodiment, the paste B is printed with a screen having smaller openings than the screen used to print paste A. The difference in opening size of the screens used to print pastes A and B is 0 to 20 microns. In certain embodiments, regardless of the thickness of each printed paste layer, the total printed area of all pastes used (A, B, and/or C) may be less than 10%, less than 8% or less than 6% of the area of the front-side.

Various configurations may be used, such that either paste A or paste B or paste C has a greater printed thickness than another paste. Any of the pastes may be formulated without glass.

Paste C is also typically used on the top layer, printed over paste A, instead of paste B. Paste C is a high conductivity paste, having only a small amount of glass frit or devoid of glass, depending on desired density. The bulk conductivity of paste C is higher than that of paste A. Paste C is a higher density paste (for example through use of combination of different size silver particles). In one embodiment paste C may comprise: (a) 50-95 wt % of a metal source; (b) 0-10 wt % of a glass component, and (c) 5-20 wt % of an organic vehicle. In some combinations, pastes A, B and C are all used.

The pastes may be dried to a dry line thickness of 5 to 90 microns, preferably 10 to 75 microns. The dried thickness of the busbars may be 1 to 20 microns, preferably 2 to 15 microns, more preferably 3 to 10 microns. The lines are printed to have an aspect ratio of 0.1 to 1, preferably 0.2 to 0.9; more preferably 0.25 to 0.9; still more preferably 0.4 to 0.8.

Printing and Firing of the Paste. The aforementioned paste compositions can be used in a process to make a contact (e.g., fired front contact film) or other components, for example, for solar cells. The method of making the contact involves (1) applying the paste composition to a silicon substrate (e.g., silicon wafer), (2) drying the paste, and (3) heating (e.g., firing) the paste to sinter the metal of the paste and make contact to silicon. The printed pattern of the paste is heated or fired at a suitable temperature, such as about 650 to about 1000° C. furnace set temperature, or about 550 to about 850° C. wafer temperature. In one embodiment, the furnace set temperature is about 750 to about 960° C., and the paste is fired in air. The antireflective $SiN_X$ layer is believed to be oxidized and corroded by the glass during firing and Ni/Si or Ag/Si islands are formed on reaction with the Si substrate, which are epitaxially bonded to silicon. Firing conditions are chosen to produce a sufficient density of conductive metal/Si islands on the silicon wafer at the silicon/paste interface, leading to a low resistivity contact, thereby producing a high efficiency, high-fill factor solar cell.

A typical ARC is made of a silicon compound such as silicon nitride, generically $SiN_X$:H, however $SiO_2$ or SiON can be used. This layer acts as an insulator, which tends to increase the contact resistance. Corrosion of this ARC layer by the glass component is hence a necessary step in front contact formation. Reducing the resistance between the silicon wafer and the paste can be facilitated by the formation of epitaxial metal/silicon conductive islands at the interface. When such an epitaxial metal/silicon interface does not result, the resistance at that interface becomes unacceptably high. The pastes and processes herein can make it possible to produce an epitaxial metal/silicon interface leading to a contact having low resistance under broad processing conditions—a minimum firing temperature as low as about 650° C., but which can be fired up to about 850° C. (wafer temperature).

Exemplary firing conditions include the following temperature profile in an Infrared Belt furnace moving at 100-300 inches per minute (ipm), preferably 150-250, for example 200 ipm, in ° C.: 400, 400, 500, 600, 700, 800±50° C.

Method of Making Contact. A solar cell contact according to the invention can be produced by applying any conductive paste disclosed herein to a substrate, for example, by screen-printing to a desired wet thickness, e.g., from about 10 to about 80 microns. Automatic screen-printing techniques can be employed using a 200-400 mesh screen. The printed pattern is then dried at 250° C. or less, preferably about 80 to about 250° C. for about 0.5-20 minutes before firing. The dry printed pattern can be fired for as little as 1 second up to about 30 seconds at peak temperature, in a belt conveyor furnace in air. During firing, the glass is fused and the metal is sintered.

Printing of pastes herein can also be done by ink jet printing with an ink jet printer controlled by computer software sold by any of a variety of companies such as Applied Materials, Pacini, Kodak, Wasatch, Hewlett-Packard, Epson, Canon, Roland DGA, ixPressia, Arnica, Jetec, Foxjet, QuadTone, or Sauven.

Figure 1A:
FIGS. 1 A-1E illustrate a process flow diagram schematically illustrating a process of making a contact in a solar cell in accordance with an embodiment of the invention. Reference numerals shown in FIGS. 1A-1E depict the following.

Referring now to FIGS. 1A-1E, one of many possible exemplary embodiments of making a solar cell front contact is illustrated. The solar cell front contact generally can be produced by applying the paste composition to a solar grade Si wafer. In particular, FIG. 1A schematically shows providing a substrate 10 of single-crystal silicon or multicrystalline silicon. The substrate can have a textured surface which reduces light reflection. In the case of solar cells, substrates are often used as sliced from ingots which have been formed from pulling or casting processes. Substrate surface damage caused by tools such as a wire saw used for slicing and contamination from the wafer slicing step are typically removed by etching away about 10 to 20 microns of the substrate surface using an aqueous alkali solution such as KOH or NaOH, or using a mixture of HF and $HNO_3$. The substrate optionally can be washed with a mixture of HCl and $H_2O_2$ to remove heavy metals such as iron that may adhere to the substrate surface. An antireflective textured surface is sometimes formed thereafter using, for example, an aqueous alkali solution such as aqueous potassium hydroxide or aqueous sodium hydroxide. This resulting substrate is depicted with exaggerated thickness dimensions, as a typical silicon wafer is about 160 to 200 microns thick.

Figure 1B:
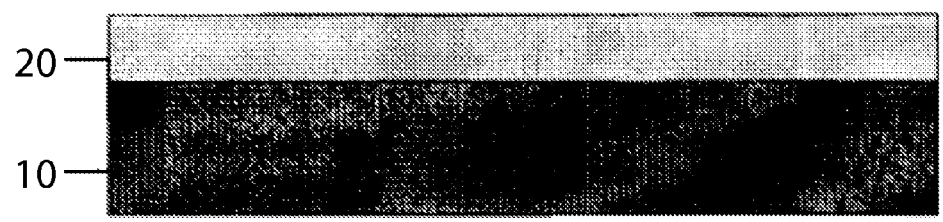

FIG. 1B schematically shows that, when a p-type substrate is used, an n-type layer 20 is formed to create a p-n junction. A phosphorus diffusion layer is supplied in any of a variety of suitable forms, including phosphorus oxychloride ($POCl_3$), organophosphorous compounds, and others disclosed herein. The phosphorus source can be selectively applied to only one side of the silicon wafer. The depth of the diffusion layer can be varied by controlling the diffusion temperature and time, is generally about 0.2 to 0.5 microns, and has a sheet resistivity of about 40 to about 120 ohms per square. The phosphorus source can include phosphorus-containing liquid coating material such as phosphosilicate glass (PSG). The phosphorus source can be applied onto only one surface of the substrate by a process such as spin coating, where diffusion is effected by annealing under suitable conditions.

Figure 1C:
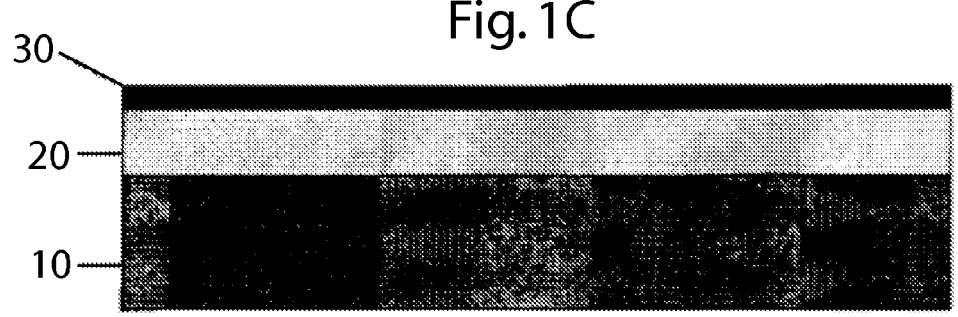

FIG. 1C illustrating forming an antireflective coating (ARC)/passivating film 30 over the substrate 10. The antireflective coating (ARC)/passivating film 30, which can be $SiN_X$, $TiO_2$ or $SiO_2$, is formed over the above-described n-type diffusion layer 20. Silicon nitride film is sometimes expressed as $SiN_X$:H to emphasize passivation by hydrogen. The ARC 30 reduces the surface reflectance of the solar cell to incident light, increasing the electrical current generated. The thickness of ARC 30 depends on its refractive index, although a thickness of about 700 to about 900 Å is suitable for a refractive index of about 1.9 to about 2.0. The ARC can be formed by a variety of procedures including low-pressure CVD, plasma CVD, or thermal CVD. When thermal CVD is used to form a $SiN_X$ coating, the starting materials are often dichlorosilane ($SiCl_2H_2$) and ammonia ($NH_3$) gas, and film formation is carried out at a temperature of at least 700° C. When thermal CVD is used, pyrolysis of the starting gases at the high temperature results in the presence of substantially no hydrogen in the silicon nitride film, giving a substantially stoichiometric compositional ratio between the silicon and the nitrogen —$Si_3N_4$. Other methods of forming an ARC can be used.

Figure 1D:
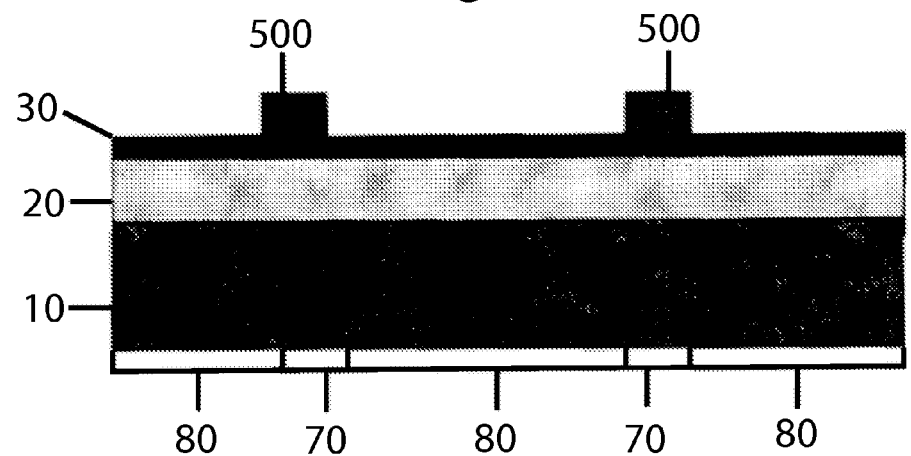

FIG. 1D illustrates applying the subject paste composition 500 over the ARC film 30. The paste composition can be applied by any suitable technique. For example, the paste composition can be applied by screen print on the front side of the substrate 10. The paste composition 500 is dried at about 125° C. for about 10 minutes. Other drying times and temperatures are possible so long as the paste vehicle is dried of solvent, but not combusted or removed at this stage.

FIG. 1D further illustrates forming a layer of back side pastes over the back side of the substrate 10. The back side paste layer can contain one or more paste compositions. In one embodiment, the first paste 70 facilitates forming a back side contact and a second paste 80 facilitates forming a p+ layer over the back side of the substrate. The first paste 70 can contain silver or silver/aluminum and the second paste 80 can contain aluminum. An exemplary backside silver/aluminum paste is Ferro 3398, PS 33-610 or PS 33-612, commercially available from Ferro Corporation, Cleveland, Ohio. An exemplary commercially available backside aluminum paste is Ferro AL53-120 Standard, or AL53-112, AL860, AL5116, commercially available from Ferro Corporation, Cleveland, Ohio.

The back side paste layer can be applied to the substrate and dried in the same manner as the front paste layer 500. In this embodiment, the back side is largely covered with the aluminum paste, to a wet thickness of about 30 to 50 microns, owing in part to the need to form a thicker p+ layer in the subsequent process.

The wafer bearing the dried pastes is then fired in an infrared belt furnace, using an air atmosphere, at a furnace set temperature of about 650° C. to about 1000° C. for a period of from about one to several minutes. The firing is generally carried out according to a temperature profile that will allow burnout of the organic matter at about 300° C. to about 550° C., a period of peak furnace set temperature of about 650° C. to about 1000° C., lasting as little as about 1 second, although longer firing times as high as 1, 3, or 5 minutes are possible when firing at lower temperatures.

Firing is typically done in an air atmosphere. For example a six-zone firing profile can be used, with a belt speed of about 1 to about 6.4 meters (40-250 inches) per minute, preferably 5 to 6 meters/minute (about 200 to 240 inches/minute). In a preferred example, zone 1 is about 18 inches (45.7 cm) long, zone 2 is about 18 inches (45.7 cm) long, zone 3 is about 9 inches (22.9 cm) long, zone 4 is about 9 inches (22.9 cm) long, zone 5 is about 9 inches (22.9 cm) long, and zone 6 is about 9 inches (22.9 cm) long. The temperature in each successive zone is typically, though not always, higher than the previous, for example, 350-500° C. in zone 1, 400-550° C. in zone 2, 450-700° C. in zone 3, 600-750° C. in zone 4, 750-900° C. in zone 5, and 800-970° C. in zone 6. Naturally, firing arrangements having more than 3 zones are envisioned by the invention, including 4, 5, 6, 7, 8 or 9 zones or more, each with zone lengths of about 5 to about 20 inches and firing temperatures of 650 to 1000° C.

Figure 1E:
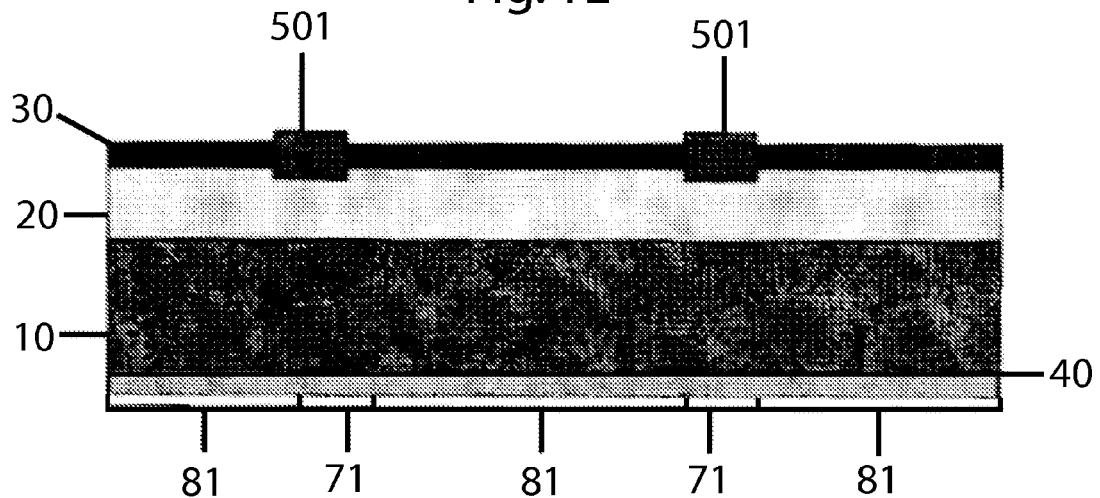

FIG. 1E illustrates sintering the metal portions of the paste 500 and fusing the glass frits of the paste 500, thereby making electrical contacts 501. As schematically shown in FIG. 1E, during firing, the front side paste 500 sinters and penetrates (i.e., fires through) the silicon nitride layer 30 and thereby makes electrical contact 501 with the n-type layer 20. The paste 80 containing aluminum over the back side melts and reacts with the silicon wafer 10, during firing, then solidifies to form a partial p+ layer 40 containing a high concentration of Al dopant. This layer is generally called the back surface field (BSF) layer, and helps to improve the energy conversion efficiency of the solar cell. A back electrode 81 can be formed by firing the paste 80. The paste 70 containing silver or silver/aluminum is fired becoming a back contact. The areas of the back side paste 71 can be used for tab attachment during module fabrication. Processes of making the pastes, solar cell contacts and solar cells disclosed herein are envisioned as embodiments of the invention.

The invention also provides a process of forming a front-side contact on a silicon wafer having a p-type region, an n-type region, a p-n junction and an ARC layer on the front-side of the silicon wafer, comprising printing a paste A having fire-through capability on the ARC layer, wherein the paste A is printed as a plurality of thin parallel finger lines having gaps therein to form a bottom print of split finger lines, printing and drying a paste B, wherein the paste B is printed in a grid pattern comprising at least two busbars intersecting the bottom print of split ringer lines at right angles and interposed in the gaps therein, and firing the double-printed silicon wafer, wherein the paste A comprises an organic vehicle and an inorganic portion comprising (a1) at least one electrically conductive metal powder and (a2) glass frit, the paste A providing, during firing, better solder wetting than paste B, when both are fired, wherein the paste B comprises an organic vehicle and an inorganic content comprising (b1) at least one electrically conductive metal powder and (b2) glass frit, the paste B providing lower contact resistance than paste A when both are fired. Pastes A and B are fully detailed herein above. This process may further include use of Paste C, also fully detailed herein above.

According to a first embodiment item 1, which relates to a process of forming a front-side solar cell contact a silicon wafer having a p-type region, an n-type region, a p-n junction and an ARC layer on said front-side, comprising:

a. applying an ARC layer to the front-side of the silicon wafer, b. printing a paste A having fire-through capability on the ARC layer, wherein the paste A is printed as a plurality of thin parallel finger lines having gaps therein to form a bottom print of split finger lines, c. printing a paste B over paste A, wherein the paste B is printed in a grid pattern comprising
  i. at least two busbars intersecting the bottom print of split finger lines at right angles and interposed in the gaps therein, and
  ii. thin parallel finger lines forming a top print of finger lines superimposing the bottom print of finger lines
  wherein the total printed area of pastes A and B is less than 10% of the area of the front-side, and d. firing the double-printed silicon wafer, wherein the paste A comprises an organic vehicle and an inorganic portion comprising (a1) at least one electrically conductive metal powder and (a2) glass frit, the paste A providing lower contact resistance than paste B, when both are fired, wherein the paste B comprises an organic vehicle and an inorganic portion comprising (b1) at least one electrically conductive metal powder and (b2) glass frit.

For embodiment item 1, the paste B may provide, during firing, better solder wetting and adhesion to silicon than paste A when both are fired Preferred embodiment item 2, which is the process of item 1, wherein at least one of paste A and paste B includes a hot melt adhesive.

Preferred embodiment item 3, which is the process of item 1, wherein paste A comprises:

a. 50-95 wt % of a metal source comprising:
  i. silver or a source of silver and
  ii. at least one metal or source of a metal selected from the group consisting of nickel, copper, palladium, platinum, and combinations thereof,
b. 0.5-15 wt % of a glass component, and
c. 5-20 wt % of an organic vehicle.

Preferred embodiment item 4, which is the process of item 3, wherein the metal source comprises an alloy of silver and at least one metal selected from the group consisting of nickel, copper, palladium, platinum, and combinations thereof.

Preferred embodiment item 5, which is the process of item 3, wherein the metal source includes nickel, and wherein the nickel is provided in the form of an organonickel compound.

Preferred embodiment item 6, which is the process of item 5, wherein the organonickel compound is selected from the group consisting of nickel acetyl acetonate and nickel 2-ethyl hexanoate.

Preferred embodiment item 7, which is the process of item 3, wherein the conductive metal powders are provided in at least one form selected from the group consisting of spherical particles, irregularly shaped particles, flakes, nano-sized particles, an agglomeration of particles, suspensions, or mixtures thereof.

Preferred embodiment item 8, which is the process of item 6, wherein the D$_{50}$ particle size of the conductive metal powders is in the range of 0.05 to 10 microns.

Preferred embodiment item 9, which is the process of item 3, wherein the glass component includes at least one Pb-containing glass frit having a softening point of 300 to 550° C.

Preferred embodiment item 10, which is the process of item 9, wherein the glass frit is selected from the group consisting of noncrystallizing glass, partially crystallizing glass, crystallizing glass and combinations thereof.

Preferred embodiment item 11, which is the process of item 9, wherein the glass frit includes an oxide of a transition metal selected from the group of Mn, Fe, Co, Ni, Cu, Ti, V, Cr, W, Nb, Ta, Hf, Rh, Ru, Pd, Pt, and combinations thereof to achieve lower contact resistance and a wider firing window.

Preferred embodiment item 12, which is the process of item 3, wherein the paste includes 0.01-10 wt % of a metal acetyl acetonate, wherein the metal of the metal acetyl acetonate is selected from the group consisting of V, Sb, Y, Co, Ni, Zr, Sn, Zn, Li, Mn, Cu, Ce, Ru, Rh, and Fe.

Preferred embodiment item 13, which is the process of item 3, wherein paste A further comprises 0.01-10 wt % of at least one metal silicate, wherein the metal silicate has the formula: MaSibOc+2b, wherein a=1, 2, or 3, b=1, 2, or 3, c=a/2, a, or 2a, and metal M is selected from the group of: Zn, Mg, Li, Mn, Co, Ni, Cu, Gd, Zr, Ce, Fe, Al, and Y.

Preferred embodiment item 14, which is the process of item 3, wherein paste A further comprises 0.01-5 wt % of an organo-lithium compound selected from the group consisting of lithium acrylate and lithium methacrylate.

Preferred embodiment item 15, which is the process of item 3, wherein paste A further comprises an organozinc compound.

Preferred embodiment item 16, which is the process of item 15, wherein the organozinc compound is present in the paste composition in an amount of 0.05 wt-30 wt %.

Preferred embodiment item 17, which is the process of item 3, wherein the metal source is an organometallic compound that is fully dissolved in the organic vehicle and the organic vehicle is free of metal particles.

Preferred embodiment item 18, which is the process of item 3, further comprising a dopant selected from the group consisting of an n-type dopant and a p-type dopant.

Preferred embodiment item 19, which is the process of item 18, wherein the dopant is selected from the group consisting of Li$_2$O, phosphorus coated silver, phosphoroesters, phosphorus, boron, gallium, arsenic, antimony, and combinations thereof.

Preferred embodiment item 20, which is the process of item 3, wherein at least one paste further comprises 0.01 to 5 wt % of an organolithium compound.

Preferred embodiment item 21, which is the process of item 3, wherein paste B comprises:
a. 40-85 wt % of a metal source comprising:
b. 0.5-15 wt % of a glass component, and
c. 5-20 wt % of an organic vehicle.

Preferred embodiment item 22, which is the process of item 21, wherein the metal source of paste B comprises silver and at least one metal selected from the group consisting of nickel, copper, palladium, and combinations thereof.

Preferred embodiment item 23, which is the process of item 21, wherein the metal source of paste B comprises an alloy of silver and at least one metal selected from the group consisting of nickel, copper, palladium, and combinations thereof.

Preferred embodiment item 24, which is the process of item 21, wherein the metal source of paste B includes nickel, and wherein the nickel is provided in the form of an organonickel compound.

Preferred embodiment item 25, which is the process of item 21, wherein the content of the metal source of paste B is less than 80 wt %.

Preferred embodiment item 26, which is the process of item 21, wherein the metal source of paste B is a powder having a particle shape selected from the group consisting of flakes, spherical particles, irregular shaped, nano-sized, an agglomeration of particles, or provided in a suspension, and combinations thereof.

Preferred embodiment item 27, which is the process of item 21, wherein the glass component of paste B comprises at least one glass frit having a softening point of 300 to 550° e.

Preferred embodiment item 28, which is the process of item 21, wherein the glass component includes at least one Pb-containing glass frit.

Preferred embodiment item 29, which is the process of item 21, wherein the glass component includes at least one glass frit that is free of lead and cadmium.

Preferred embodiment item 30, which is the process of item 21, wherein the glass frit is not capable of firing through an antireflective coating.

Preferred embodiment item 31, which is the process of item of item 21, wherein the Tg of the glass component of paste B is not higher than the T g of the glass component of paste A.

Preferred embodiment item 32, which is the process of item 21, wherein paste B further comprises adhesion promoter.

Preferred embodiment item 33, which is the process of item 21, wherein the organic vehicle of paste B further comprises a leveling agent.

Preferred embodiment item 34, which is the process of item 21, wherein the total proportion of metal and glass in paste B is less than the total proportion in paste A.

Preferred embodiment item 35, which is the process of item 1, wherein paste A includes a hot melt adhesive, and the process further comprises, after step (c), step (c1) drying paste B.

Preferred embodiment item 36, which is the process of item I, wherein paste B includes a hot melt adhesive, and the process further comprises, after step (b), step (b1) drying paste A.

Preferred embodiment item 37, which is the process of item 1, wherein, following at least one of step (b) and step (c), respectively, the process further comprises at least one of: step (b1) drying paste A, and step (e1) drying paste B.

Preferred embodiment item 38, which is the process of item 1, wherein (b) printing a paste A includes at least one of (b1) printing paste A through a stencil to a wet thickness of 10-100 microns and (b2) screen printing paste A, the screen having an opening of 80 microns or less.

Preferred embodiment item 39, which is the process of item 1, wherein the paste A has a greater printed thickness than paste B.

Preferred embodiment item 40, which is the process of item 1, wherein the paste B has a greater printed thickness than paste A.

Preferred embodiment item 41, which is the process of item 1, at least one of paste A and paste B is printed with an ink-jet printer.

Preferred embodiment item 42, which is the process of item 1, wherein paste B excludes glass.

Preferred embodiment item 43, which is the process of item 3 further comprising drying at least one of paste A and paste B such that the dry line thickness of the printed paste A is 10 to 75 microns.

Preferred embodiment item 44, which is the process of item 43, wherein the dry thickness of the busbars is 3 to 10 microns.

Preferred embodiment item 45, which is the process of item 3, wherein the aspect ratio of the lines is 0.1 to 1.

According to a second embodiment item 46, which relates to a process of forming a front-side contact on a silicon wafer having a p-type region, an n-type region, a p-n junction and an ARC layer on said front-side, comprising:

a. printing a paste A having fire-through capability on the ARC layer, wherein the paste A is printed as a plurality of thin parallel finger lines having gaps therein to form a bottom print of split finger lines, b. printing and drying a paste B, wherein the paste B is printed in a grid pattern comprising at least two busbars intersecting the bottom print of split finger lines at right angles and interposed in the gaps therein, and c. firing the double-printed silicon wafer, wherein the paste A comprises an organic vehicle and an inorganic portion comprising (a1) at least one electrically conductive metal powder and (a2) glass frit, the paste A providing, during firing, better solder wetting than paste B, when both are fired, wherein the paste B comprises an organic vehicle and an inorganic content comprising (b1) at least one electrically conductive metal powder and (b2) glass frit, the paste B providing lower contact resistance than paste A when both are fired.

Preferred embodiment item 47, which is the process of item 46, wherein paste A comprises a hot-melt adhesive.

Preferred embodiment item 48, which is the process of item 46, wherein paste A includes an organic vehicle, and wherein paste A is printed through a stencil.

Preferred embodiment item 49, which is the process of item 46, wherein paste A comprises:
 a. 50-95 wt % of a metal source comprising:
  i. silver or a source of silver and
  ii. at least one metal or source of a metal selected from the group consisting of nickel, copper, palladium, platinum, and combinations thereof,
 b. 0.5-15 wt % of a glass component, and
 c. 5-20 wt % of an organic vehicle.

Preferred embodiment item 50, which is the process of item 49, wherein the metal source comprises an alloy of silver and at least one metal selected from the group consisting of nickel, copper, palladium, platinum, and combinations thereof.

Preferred embodiment item 51, which is the process of item 49, wherein the metal source includes nickel, and wherein the nickel is provided in the form of an organonickel compound.

Preferred embodiment item 52, which is the process of item 51, wherein the organonickel compound is selected from the group consisting of nickel acetyl acetonate and nickel 2-ethyl hexanoate.

Preferred embodiment item 53, which is the process of item 49, wherein the conductive metal powders are provided in at least one form selected from the group consisting of spherical particles, irregularly shaped particles, flakes, nano-sized particles, an agglomeration of particles, suspensions, or mixtures thereof.

Preferred embodiment item 54, which is the process of item 53, wherein the $D_{50}$ particle size of the conductive metal powders is in the range of 0.05 to 10 microns.

Preferred embodiment item 55, which is the process of item 49, wherein the glass component includes at least one Pb-containing glass fit having a softening point of 300 to 550° C.

Preferred embodiment item 56, which is the process of item 55, wherein the glass frit is selected from the group consisting of noncrystallizing glass, partially crystallizing glass, crystallizing glass and combinations thereof.

Preferred embodiment item 57, which is the process of item 55, wherein the glass frit includes an oxide of a transition metal selected from the group of Mn, Fe, Co, Ni, Cu, Ti, V, Cr, W, Nb, Ta, Hf, Rh, Ru, Pd, Pt, and combinations thereof to achieve lower contact resistance and a wider firing window.

Preferred embodiment item 58, which is the process of item 49, wherein the paste includes 0.01-10 wt % of a metal acetyl acetonate, wherein the metal of the metal acetyl acetonate is selected from the group consisting of V, Sb, Y, Co, Ni, Zr, Sn, Zn, Li, Mn, Cu, Ce, Ru, Rh, and Fe.

Preferred embodiment item 59, which is the process of item 49, wherein paste A further comprises 0.01-10 wt % of at least one metal silicate, wherein the metal silicate has the formula: $M_a Si_b O_{c+2b}$, wherein a=1, 2, or 3, b=1, 2, or 3, a/b=1/3 to 3, c=1/2a, a, or 2a, and metal M is selected from the group of: Zn, Mg, Li, Mn, Co, Ni, Cu, Gd, Zr, Ce, Fe, Al, and Y.

Preferred embodiment item 9, which is the process of item 49, wherein paste A further comprises 0.01-5 wt % of an organo-lithium compound selected from the group consisting of lithium acrylate and lithium methacrylate.

Preferred embodiment item 60, which is the process of item 49, wherein paste A further comprises an organozinc compound.

Preferred embodiment item 62, which is the process of item 61, wherein the organozinc compound is present in the paste composition in an amount of 0.05 wt-30 wt %.

Preferred embodiment item 63, which is the process of item 49, wherein the metal source is an organometallic compound that is fully dissolved in the organic vehicle, and the organic vehicle is free of metal particles.

Preferred embodiment item 64, which is the process of item 49, wherein paste C comprises:
 a. 50-95 wt % of a metal source;
 b. 0-10 wt % of a glass component, and
 c. 5-20 wt % of an organic vehicle.

Preferred embodiment item 65, which is the process of item 64, wherein the metal source of paste C comprises silver and at least one metal selected from the group consisting of nickel, copper, palladium, and combinations thereof.

Preferred embodiment item 66, which is the process of item 64, wherein the metal source of paste C comprises an alloy of silver and at least one metal selected from the group consisting of nickel, copper, palladium, and combinations thereof.

Preferred embodiment item 67, which is the process of item 64, wherein the metal source of paste C includes nickel, and wherein the nickel is provided in the form of an organonickel compound.

Preferred embodiment item 68, which is the process of item 64, wherein the content of the metal source of paste C is less than 80 wt %.

Preferred embodiment item 69, which is the process of item 64, wherein the metal source of paste C is a powder having a particle shape selected from the group consisting of spherical shaped, irregular shaped, flakes, or nano-sized powders or suspensions, and combinations thereof.

Preferred embodiment item 70, which is the process of item 64, wherein the glass component of paste C comprises at least one glass frit having a softening point of 300 to 550° C.

Preferred embodiment item 71, which is the process of item 64, wherein the glass component includes at least one Pb-containing glass frit.

Preferred embodiment item 72, which is the process of item 64, wherein the glass component includes at least one glass frit that is free of lead and cadmium.

Preferred embodiment item 73, which is the process of item 64, wherein the glass frit is not capable of firing through an antireflective coating.

Preferred embodiment item 74, which is the process of item of item 64, wherein the Tg of the glass component of paste C is not higher than the Tg of the glass component of paste A.

Preferred embodiment item 75, which is the process of item 64, wherein paste C further comprises an adhesion promoter.

Preferred embodiment item 76, which is the process of item 64, wherein the organic vehicle of paste C further comprises a leveling agent.

Preferred embodiment item 77, which is the process of item 64, wherein the total proportion of metal and glass in paste C is less than the total proportion in paste A.

Preferred embodiment item 78, which is the process of item 46, wherein paste A includes a hot melt adhesive, and the process further comprises, after step (c), step (c1) drying paste C.

Preferred embodiment item 79, which is the process of item 46, wherein paste C includes a hot melt adhesive, and the process further comprises, after step (b), step (b 1) drying paste A.

Preferred embodiment item 80, which is the process of item 46, wherein, following at least one of step (b) and step (c), respectively, the process further comprises at least one of: step (b1) drying paste A, and step (e1) drying paste C.

Preferred embodiment item 81, which is the process of item 46, wherein (b) printing a paste A includes printing paste A through a stencil to a wet thickness of 10-100 microns.

Preferred embodiment item 82, which is the process of item 46, wherein the paste A has a greater printed thickness than paste C.

Preferred embodiment item 83, which is the process of item 46, wherein the paste C has a greater printed thickness than paste A.

Preferred embodiment item 84, which is the process of item 46, at least one of paste A and paste C is printed with an ink-jet printer.

Preferred embodiment item 85, which is the process of item 46, wherein paste B excludes glass.

According to a second embodiment item 86, which relates to a process of forming a front-side contact on a silicon wafer having a p-type region, an n-type region, a p-n junction and an ARC layer on said front-side, comprising:

a. screen printing and drying a paste B having non fire-through capability to form at least two parallel busbars, b. printing a paste A having fire-through capability on the ARC layer through a stencil, wherein the paste A is printed in a pattern comprising thin parallel fingers connecting the at least two parallel busbars, and c. firing the double-printed silicon wafer, wherein the paste A comprises a hot-melt adhesive and an inorganic portion comprising (a1) at least one electrically conductive metal powder and (a2) glass frit, the paste A providing lower contact resistance than paste B, when both are fired, and wherein the paste B comprises an organic vehicle and an inorganic content comprising (b1) at least one electrically conductive metal powder and (b2) glass frit, the paste B providing, during firing, better solder wetting and adhesion to silicon than paste A, when both are fired.

Preferred embodiment item 87, which is the process of item 86, wherein paste A comprises a hot-melt adhesive.

Preferred embodiment item 88, which is the process of item 86, wherein paste A includes an organic vehicle, and wherein paste A is printed through a stencil.

Preferred embodiment item 89, which is the process of item 86, wherein paste A comprises:

a. 50-95 wt % of a metal source comprising:
b. 0.5-15 wt % of a glass component, and
c. 5-20 wt % of an organic vehicle.

Preferred embodiment item 90, which is the process of item 89, wherein the metal source comprises an alloy of silver and at least one metal selected from the group consisting of nickel, copper, palladium, platinum, and combinations thereof.

Preferred embodiment item 91, which is the process of item 89, wherein the metal source includes nickel, and wherein the nickel is provided in the form of an organonickel compound.

Preferred embodiment item 92, which is the process of item 91, wherein the organonickel compound is selected from the group consisting of nickel acetyl acetonate and nickel 2-ethyl hexanoate.

Preferred embodiment item 93, which is the process of item 90, wherein the conductive metal powders are provided in at least one form selected from the group consisting of spherical particles, irregularly shaped particles, flakes, nano-sized particles, an agglomeration of particles, suspensions, or mixtures thereof.

Preferred embodiment item 94, which is the process of item 93, wherein the D50 particle size of the metal source is in the range of 0.05 to 10 microns.

Preferred embodiment item 95, which is the process of item 89 wherein the glass component includes at least one Pb-containing glass frit having a softening point of 300 to 550° C.

Preferred embodiment item 96, which is the process of item 95, wherein the glass frit is selected from the group consisting of noncrystallizing glass, partially crystallizing glass, crystallizing glass and combinations thereof.

Preferred embodiment item 97, which is the process of item 95, wherein the glass frit includes an oxide of a transition metal selected from group of Mn, Fe, Co, Ni, Cu, Ti, V, Cr, W, Nb, Ta, Hf, Rh, Ru, Pd, Pt, and combinations thereof to achieve lower contact resistance and a wider firing window.

Preferred embodiment item 98, which is the process of item 89, wherein the paste includes 0.01-10 wt % of a metal acetyl acetonate, wherein the metal of the metal acetyl acetonate is selected from the group consisting of V, Zn, Mn, Co, Ni, Cu, Y, Zr, Ce, Ru, Rh, and Fe.

Preferred embodiment item 99, which is the process of item 89, wherein paste A further comprises 0.01-10 wt % of at least one metal silicate, wherein the metal silicate has the formula: $Ma SibOc+2b$, wherein a=1, 2, or 3, b=1, 2, or 3, a/b=1l3 to 3, c=1l2a, a, or 2a, and metal M is selected from the group of: Zn, Mg, Li, Mn, Co, Ni, Cu, Gd, Zr, Ce, Fe, Al, and Y.

Preferred embodiment item 100, which is the process of item 89, wherein paste A further comprises 0.01-5 wt % of an organolithium compound selected from the group consisting of lithium acrylate and lithium methacrylate.

Preferred embodiment item 101, which is the process of item 89, wherein paste A further comprises an organozinc compound.

Preferred embodiment item 102, which is the process of item 101, wherein the organozinc compound is present in the paste composition in an amount of 0.05 wt-30 wt %.

Preferred embodiment item 103, which is the process of item 89, wherein the metal source is an organometallic compound that is fully dissolved in the organic vehicle, and the organic vehicle is free of metal particles.

Preferred embodiment item 104, which is the process of item 89, wherein paste B comprises:
  a. 40-85 wt % of a metal source comprising:
  b. 0.5-15 wt % of a glass component, and
  c. 5-20 wt % of an organic vehicle.

Preferred embodiment item 105, which is the process of item 104, wherein the metal source of paste B comprises silver and at least one metal selected from the group consisting of nickel, copper, palladium, and combinations thereof.

Preferred embodiment item 106, which is the process of item 104, wherein the metal source of paste B comprises an alloy of silver and at least one metal selected from the group consisting of nickel, copper, palladium, and combinations thereof.

Preferred embodiment item 107, which is the process of item 105, wherein the metal source of paste B includes nickel, and wherein the nickel is provided in the form of an organonickel compound.

Preferred embodiment item 108, which is the process of item 104, wherein the content of the metal source of paste B is less than 80 wt %.

Preferred embodiment item 109, which is the process of item 104, wherein the metal source of paste B is a powder having a particle shape selected from the group consisting of spherical shaped, irregular shaped, flakes, or nano-sized powders or suspensions, and combinations thereof.

Preferred embodiment item 110, which is the process of item 104, wherein the glass component of paste B comprises at least one glass frit having a softening point of 300 to 550° e.

Preferred embodiment item 111, which is the process of item 104, wherein the glass component includes at least one Pb-containing glass frit.

Preferred embodiment item 112, which is the process of item 104, wherein the glass component includes at least one glass frit that is free of lead and cadmium.

Preferred embodiment item 113, which is the process of item 104, wherein the glass frit is not capable of firing through an anti reflective coating.

Preferred embodiment item 114, which is the process of item of item 104, wherein the Tg of the glass component of paste B is not higher than the Tg of the glass component of paste A.

Preferred embodiment item 115, which is the process of item 104, wherein paste B further comprises adhesion promoter.

Preferred embodiment item 116, which is the process of item 104, wherein the organic vehicle of paste B further comprises a leveling agent in order that paste B can form smooth [mal printed lines.

Preferred embodiment item 117, which is the process of item 104, wherein the total proportion of metal and glass in paste B is less than the total proportion in paste A.

Preferred embodiment item 118, which is the process of item 86, wherein paste A includes a hot melt adhesive, and the process further comprises, after step (c), step (c 1) drying paste B.

Preferred embodiment item 119, which is the process of item 86, wherein paste B includes a hot melt adhesive, and the process further comprises, after step (b), step (b 1) drying paste A.

Preferred embodiment item 120, which is the process of item 86, wherein, following at least one of step (b) and step (c), respectively, the process further comprises at least one of: step (b 1) drying paste A, and step (c1) drying paste B.

Preferred embodiment item 121, which is the process of item 86, wherein (b) printing a paste A includes printing paste A through a stencil to a wet thickness of 10-100 microns.

Preferred embodiment item 122, which is the process of item 86, wherein the paste A has a greater printed thickness than paste B.

Preferred embodiment item 123, which is the process of item 86, wherein the paste B has a greater printed thickness than paste A.

Preferred embodiment item 124, which is the process of item 86, at least one of paste A and paste B is printed with an ink jet printer.

Preferred embodiment item 125, which is the process of item 86, wherein paste B excludes glass.

According to a third embodiment item 126, which relates to a process of forming a front-side contact on a silicon wafer having a p-type region, an n-type region, a p-n junction and an ARC layer on said front-side, comprising:
  a. printing a paste A having fire-through capability on the ARC layer, wherein the paste A is printed in a grid pattern comprising
    i. thin parallel finger lines forming a bottom print of finger lines and
    ii. at least two parallel busbars intersecting the finger lines at right angles, and
  b. printing and drying a paste A, B, or C over the bottom print of finger lines, wherei the paste A, B, or C is printed in a grid pattern comprising thin parallel finger lines forming a top print of finger lines superimposing the bottom print of finger lines and
  c. firing the double-printed silicon wafer,
  wherein the paste A comprises an a hot-melt adhesive and an inorganic portion comprising (a1) at least one electrically conductive metal powder and (a2) glass frit, the paste A providing, during firing, better solder wetting and adhesion to silicon than paste B, when both are fired, and wherein the paste C comprises an organic vehicle and an inorganic content comprising (c1) at least one electrically conductive metal powder and (c2) glass frit, the paste A providing lower contact resistance than paste C, when both are fired.

Preferred embodiment item 127, which is the process of item 126, wherein at least one of paste A and whichever is present of pastes B or C, includes a hot melt adhesive.

Preferred embodiment item 128, which is the process of item 126, wherein paste A comprises:
 a. 50-95 wt % of a metal source comprising:
 b. 0.5-15 wt % of a glass component, and
 c. 5-20 wt % of an organic vehicle.

Preferred embodiment item 129, which is the process of item 128, wherein the metal source comprises an alloy of silver and at least one metal selected from the group consisting of nickel, copper, palladium, platinum, and combinations thereof.

Preferred embodiment item 130, which is the process of item 128, wherein the metal source includes nickel, and wherein the nickel is provided in the form of an organonickel compound.

Preferred embodiment item 131, which is the process of item 130, wherein the organonickel compound is selected from the group consisting of nickel acetyl acetonate and nickel 2-ethyl hexanoate.

Preferred embodiment item 132, which is the process of item 128, wherein the conductive metal powders are provided in at least one form selected from the group consisting of spherical particles, irregularly shaped particles, flakes, nano-sized particles, an agglomeration of particles, suspensions, or mixtures thereof.

Preferred embodiment item 133, which is the process of item 132, wherein the Dso particle size of the conductive metal powders is in the range of 0.05 to 10 microns.

Preferred embodiment item 134, which is the process of item 128, wherein the glass component includes at least one Pb containing glass &it having a softening point of 300 to 550° C.

Preferred embodiment item 135, which is the process of item 134, wherein the glass frit is selected from the group consisting of non-crystallizing glass, partially crystallizing glass, crystallizing glass and combinations thereof.

Preferred embodiment item 136, which is the process of item 134, wherein the glass frit includes an oxide of a transition metal selected from the group of Mn, Fe, Co, Ni, Cu, Ti, V, Cr, W, Nb, Ta, Hf, Rh, Ru, Pd, Pt, and combinations thereof to achieve lower contact resistance and a wider firing window.

Preferred embodiment item 137, which is the process of item 128, wherein the paste includes 0.01-10 wt % of a metal acetyl acetonate, wherein the metal of the metal acetyl acetonate is selected from the group consisting of V, Sb, Y, Co, Ni, Zr, Sn, Zn, Li, Mn, Cu, Ce, Ru, Rh, and Fe.

Preferred embodiment item 138, which is the process of item 128, wherein paste A further comprises 0.01-10 wt % of at least one metal silicate, wherein the metal silicate has the formula: $M_aSi_bO_{c+2b}$, wherein a=1, 2, or 3, b=1, 2, or 3, c=a/2, a, or 2a, and metal M is selected from the group of: Zn, Mg, Li, Mn, Co, Ni, Cu, Gd, Zr, Ce, Fe, Al, and Y.

Preferred embodiment item 139, which is the process of item 128, wherein paste A further comprises 0.01-5 wt % of an organolithium compound selected from the group consisting of lithium acrylate and lithium methacrylate.

Preferred embodiment item 140, which is the process of item 128, wherein paste A further comprises an organozinc compound.

Preferred embodiment item 141, which is the process of item 140, wherein the organozinc compound is present in the paste composition in an amount of 0.05 wt-30 wt %.

Preferred embodiment item 142, which is the process of item 128, wherein the metal source is an organometallic compound that is fully dissolved in the organic vehicle and the organic vehicle is free of metal particles.

Preferred embodiment item 143, which is the process of item 128, further comprising a dopant selected from the group consisting of an n-type dopant and a p-type dopant.

Preferred embodiment item 144, which is the process of item 143, wherein the dopant is selected from the group consisting of $Li_2O$, phosphorus coated silver, phosphoroesters, phosphorus, boron, gallium, arsenic, antimony, and combinations thereof.

Preferred embodiment item 145, which is the process of item 128, wherein at least one paste further comprises 0.01 to 5 wt % of an organolithium compound.

Preferred embodiment item 146, which is the process of item 128, wherein paste B comprises:
 a. 40-85 wt % of a metal source comprising:
 b. 0.5-15 wt % of a glass component, and
 c. 5-20 wt % of an organic vehicle.

Preferred embodiment item 147, which is the process of item 146, wherein the metal source of paste B comprises silver and at least one metal selected from the group consisting of nickel, copper, palladium, and combinations thereof.

Preferred embodiment item 148, which is the process of item 146, wherein the metal source of paste B comprises an alloy of silver and at least one metal selected from the group consisting of nickel, copper, palladium, and combinations thereof.

Preferred embodiment item 149, which is the process of item 146, wherein the metal source of paste B includes nickel, and wherein the nickel is provided in the form of an organonickel compound.

Preferred embodiment item 150, which is the process of item 146, wherein the content of the metal source of paste B is less than 80 wt %.

Preferred embodiment item 151, which is the process of item 146, wherein the metal source of paste B is a powder having a particle shape selected from the group consisting of spherical shaped, irregular shaped, flakes, or nano-sized powders or suspensions, and combinations thereof.

Preferred embodiment item 152, which is the process of item 146, wherein the glass component of paste B comprises at least one glass frit having a softening point of 300 to 550 DC.

Preferred embodiment item 153, which is the process of item 146, wherein the glass component includes at least one Pb-containing glass frit.

Preferred embodiment item 154, which is the process of item 146, wherein the glass component includes at least one glass fit that is free of lead and cadmium.

Preferred embodiment item 155, which is the process of item 146, wherein the glass frit is not capable of firing through an antireflective coating.

Preferred embodiment item 156, which is the process of item of item 146, wherein the Tg of the glass component of paste B is not higher than the Tg of the glass component of paste A.

Preferred embodiment item 157, which is the process of item 146, wherein paste B further comprises adhesion promoter.

Preferred embodiment item 158, which is the process of item 146, wherein the organic vehicle of paste B further comprises a leveling agent.

Preferred embodiment item 159, which is the process of item 146, wherein the total proportion of metal and glass in paste B is less than the total proportion in paste A.

Preferred embodiment item 160, which is the process of item 126, wherein paste A includes a hot melt adhesive, and the process further comprises, after step (c), step (c 1) drying paste B.

Preferred embodiment item 161, which is the process of item 126, wherein paste B includes a hot melt adhesive, and the process further comprises, after step (b), step (b 1) drying paste A.

Preferred embodiment item 162, which is the process of item 126, wherein, following at least one of step (b) and step (c), respectively, the process further comprises at least one of: step (b 1) drying paste A, and step (c1) drying paste B.

Preferred embodiment item 163, which is the process of item 126, wherein (b) printing a paste A includes at least one of (b1) printing paste A through a stencil to a wet thickness of 10-100 microns and (b2) screen printing paste A, the screen having an opening of 80 microns or less.

Preferred embodiment item 164, which is the process of item 126, wherein the paste B is printed with a screen having smaller openings than the screen used to print paste A.

Preferred embodiment item 165, which is the process of item 164, wherein the difference in the opening size of the screens used to print pastes A and B is 0 to 20 microns.

Preferred embodiment item 166, which is the process of item 126, wherein the paste A has a greater printed thickness than paste B.

Preferred embodiment item 167, which is the process of item 126, wherein the paste B has a greater printed thickness than paste A.

Preferred embodiment item 168, which is the process of item 126, at least one of paste A and paste B is printed with an ink jet printer.

Preferred embodiment item 169, which is the process of item 126, wherein paste B excludes glass.

Preferred embodiment item 170, which is the process of item 128, further comprising drying at least one of paste A and paste B such that the dry line thickness of the printed paste A is 10 to 75 microns.

Preferred embodiment item 171, which is the process of item 170, wherein the dry thickness of the busbars is 3 to 10 microns.

Preferred embodiment item 172, which is the process of item 128, wherein the aspect ratio of the lines is 0.1 to 1.

According to a fourth embodiment item 173, which relates to a process of forming a front-side solar cell contact a silicon wafer having a p-type region, an n-type region, a p-n junction and an ARC layer on said front-side, comprising:

a. applying an ARC layer to the front-side of the silicon wafer,
  b. printing a first paste A having fire-through capability on the ARC layer, wherein the paste A is printed as a plurality of thin parallel split finger lines having gaps therein to form a bottom print of split finger lines,
  c. printing a second paste A or B or C over first paste A, wherein the second paste A or B or C is printed in a grid pattern comprising thin parallel finger lines forming a top print of finger lines superimposing the bottom print of finger lines,
  d. printing a third paste B over the first and second pastes wherein the paste B is printed as at least two busbars intersecting the bottom print of split finger lines at right angles and interposed in the gaps therein,
    wherein the total printed area of the first, second and third pastes is less than 10% of the area of the front-side, and
  e. firing the triple-printed silicon wafer,
    wherein the paste A comprises an organic vehicle and an inorganic portion comprising (a1) at least one electrically conductive metal powder and (a2) glass frit, the paste A providing lower contact resistance than paste B, when both are fired,
    wherein the paste B comprises an organic vehicle and an inorganic content comprising (b1) at least one electrically conductive metal powder and (b2) glass frit, the paste B providing, during firing, better solder wetting and adhesion to silicon than paste A when both are fired, and
    wherein the paste C comprises an organic vehicle and an inorganic content comprising (c1) at least one electrically conductive metal powder and (c2) glass frit, the paste C providing lower contact resistance than paste A when both are fired.

According to a fifth embodiment item 174, which relates to a process of forming a front-side solar cell contact a silicon wafer having a p-type region, an n-type region, a p-n junction and an ARC layer on said front-side, comprising:

a. applying an ARC layer to the front-side of the silicon wafer,
  b. printing a paste A having fire-through capability on the ARC layer, wherein the paste A is printed as a plurality of continuous thin parallel finger lines to form a bottom print of continuous finger lines,
  c. printing a paste B over paste A, wherein the paste B is printed in a grid pattern comprising
    i. at least two busbars intersecting the bottom print of split finger lines at right angles and interposed in the gaps therein, and
    ii. thin parallel finger lines forming a top print of finger lines superimposing the bottom print of finger lines
      wherein the total printed area of pastes A and B is less than 10% of the area of the front-side, and
  d. firing the double-printed silicon wafer,
    wherein the paste A comprises an organic vehicle and an inorganic portion comprising (a1) at least one electrically conductive metal powder and (a2) glass frit, the paste A providing lower contact resistance than paste B, when both are fired,
    wherein the paste B comprises an organic vehicle and an inorganic content comprising (b1) at least one electrically conductive metal powder and (b2) glass frit, the paste B providing, during firing, better solder wetting and adhesion to silicon than paste A when both are fired.

According to a sixth embodiment item 175, which relates to a process of forming a front-side solar cell contact a silicon wafer having a p-type region, an n-type region, a p-n junction and an ARC layer on said front-side, comprising:

a. applying an ARC layer to the front-side of the silicon wafer,
  b. printing a first paste A having fire-through capability on the ARC layer, wherein the paste A is printed as a plurality of continuous thin parallel finger lines to form a bottom print of continuous finger lines,
  c. printing a second paste A or B or C over paste A, wherein the second paste is printed in a grid pattern comprising continuous thin parallel finger lines forming a top print of finger lines superimposing the bottom print of finger lines, leaving gaps therein,
  d. printing a third paste B over the first and second pastes wherein the third paste is printed as at least two busbars intersecting the bottom print of split finger lines at right angles and interposed in the gaps therein,
    wherein the total printed area of the first, second and third pastes is less than 10% of the area of the front-side, and
  e. firing the triple-printed silicon wafer,
    wherein the paste A comprises an organic vehicle and an inorganic portion comprising (a1) at least one electrically conductive metal powder and (a2) glass frit, the paste A providing lower contact resistance than paste B, when both are fired, wherein the paste B comprises an organic vehicle and an inorganic content comprising (b1) at least one electrically conductive metal powder and (b2) glass frit, the paste B providing, during firing, better solder wetting and adhesion to silicon than paste A when both are fired, wherein the paste C comprises an organic vehicle and an inorganic content comprising (c1) at least one electrically conductive metal powder and (c2) glass frit, the paste B providing lower contact resistance than paste A when both are fired.

According to a seventh embodiment item 176, which relates to a process of forming a front-side contact on a silicon wafer having a p-type region, an n-type region, a p-n junction and an ARC layer on said front-side, comprising:

a. printing a first paste A having fire-through capability on the ARC layer, wherein the paste A is printed in a grid pattern comprising
  i. thin parallel finger lines forming a bottom print of finger lines and
  ii. at least two parallel busbars intersecting the finger lines at right angles, and
b. printing and drying a second paste A, B, or C over the first paste wherein the second paste is printed in a grid pattern comprising continuous thin parallel finger lines forming a top print of finger lines superimposing the bottom print of finger lines and
c. firing the double-printed silicon wafer, wherein the paste A comprises an hot-melt adhesive and an inorganic portion comprising (a1) at least one electrically conductive metal powder and (a2) glass frit, the paste A providing, during firing, better solder wetting and adhesion to silicon than paste B, when both are fired, and wherein the paste B comprises an organic vehicle and an inorganic content comprising (b1) at least one electrically conductive metal powder and (b2) glass frit, the the paste B providing lower contact resistance than paste A, when both are fired.

According to a eighth embodiment item 177, which relates to a process of forming a front-side solar cell contact a silicon wafer having a p-type region, an n-type region, a p-n junction and an ARC layer on said front-side, comprising:

a. applying an ARC layer to the front-side of the silicon wafer,
b. printing a first paste A having fire-through capability on the ARC layer, wherein the paste A is printed in a grid pattern comprising
  i. thin parallel finger lines forming a bottom print of finger lines and
  ii. at least two parallel busbars intersecting the finger lines at right angles, and
c. printing a second paste A or B or C over the first paste, wherein the second paste is printed in a grid pattern comprising
  i. thin parallel finger lines superimposing the bottom print of finger lines and
  ii. at least two parallel busbars intersecting the finger lines at right angles, and
  wherein the total printed area of the first, second and third pastes is less than 10% of the area of the front-side, and
d. firing the double-printed silicon wafer, wherein the paste A comprises an organic vehicle and an inorganic portion comprising (a1) at least one electrically conductive metal powder and (a2) glass frit, the paste A providing lower contact resistance than paste B, when both are fired, wherein the paste B comprises an organic vehicle and an inorganic content comprising (b1) at least one electrically conductive metal powder and (h2) glass frit, the paste B providing, during firing, better solder wetting and adhesion to silicon than paste A when both are fired, wherein the paste C comprises an organic vehicle and an inorganic content comprising (c1) at least one electrically conductive metal powder and (c2) glass frit, the paste B providing lower contact resistance than paste A when both are fired.

According to a ninth embodiment item 178, which relates to a process of forming a front-side contact on a silicon wafer having a p-type region, an n-type region, a p-n junction and an ARC layer on said front-side, comprising:

a. printing and drying a paste B having fire-through capability through a stencil between the at least two parallel busbars, wherein the paste B is printed in a grid pattern comprising thin parallel finger lines connecting the at least two parallel busbars,
b. printing a paste A having fire-through capability on the ARC layer through a stencil, wherein the paste A is printed in a pattern comprising at least two parallel busbars, and
c. firing the double-printed silicon wafer, wherein the paste A comprises an a hot-melt adhesive and an inorganic portion comprising (a1) at least one electrically conductive metal powder and (a2) glass frit, the paste A providing lower contact resistance than paste B, when both are fired, wherein the paste B comprises an organic vehicle and an inorganic content comprising (b1) at least one electrically conductive metal powder and (b2) glass frit, the paste B providing, during firing, better solder wetting and adhesion to silicon than paste A, when both are fired.

EXPERIMENTAL EXAMPLES

The following examples illustrate the subject invention. Unless otherwise indicated in the following examples and elsewhere in the specification and claims, all parts and percentages are by weight, all temperatures are in degrees Celsius, and pressure is at or near atmospheric pressure.

Polycrystalline silicon wafers, 15.6 cm×15.6 cm, thickness of 150 to 250 microns are coated with a silicon nitride anti-reflective coating. The sheet resistivity of these wafers is about 55-110 Ω/square. The paste compositions are printed using a 280 or 325 mesh screen with about 110 micron openings for front contact finger lines and about 2.5 mm spacing between the lines. Samples are dried at about 250° C. for about 3 minutes after printing the front contacts. The printed wafers are co-fired in air using a 6-zone infrared (IR) belt furnace from Despatch, with a belt speed of about 5 meters (200") per minute, with temperature set points of 880 to 940° C. in the last zone. The zones are 18", 18", 9", 9", 9" and 9" long, respectively. The fired finger width for most samples is about 80 to about 160 microns, and the fired thickness is about 10 to 50 microns.

Electrical performance of the solar cells is measured with a solar tester, Model NCT-M-180A, NPC Incorporated, Dumont, N.J., under AM 1.5 sun conditions, in accordance with ASTM G-173-03.

It will be appreciated that although the examples herein primarily concern a conductive composition for use in forming a conductor paste for in the formation of solar cell contacts, the invention also contemplates the use of the principles disclosed herein to form resistor and semiconductor pastes, inks, tapes and the like. Furthermore, such compositions may or may not be considered as materials for use in forming thick films. Thus, applicants' unique conductive compositions can be utilized to form conductive, resistive or semiconducting paths or patterns on substrates. Such conductive compositions can assume various forms including an ink, a paste, a tape and the like. Additionally, substrates other than silicon can be employed in connection with the pastes of the invention. The use of the compositions disclosed herein is also envisioned in a variety of electronic components and devices.

What has been described above includes examples of the subject invention. It is, of course, not possible to describe every conceivable combination of components or methodologies for purposes of describing the subject invention, but one of ordinary skill in the art may recognize that many further combinations and permutations of the subject invention are possible. Accordingly, the subject invention is intended to embrace all such alterations, modifications and variations that fall within the spirit and scope of the appended claims. Furthermore, to the extent that the terms "contain," "have," "include," and "involve" are used in either the detailed description or the claims, such terms are intended to be inclusive in a manner similar to the term "comprising" as "comprising" is interpreted when employed as a transitional word in a claim. In some instances, however, to the extent that the terms "contain," "have," "include," and "involve" are used in either the detailed description or the claims, such terms are intended to be partially or entirely exclusive in a manner similar to the terms "consisting of" or "consisting essentially of" as "consisting of" or "consisting essentially of" are interpreted when employed as a transitional word in a claim.

The invention claimed is:

1. A process of forming a front-side solar cell contact a silicon wafer having a p-type region, an n-type region, a p-n junction and an ARC layer on said front-side, comprising:
   a. applying an ARC layer to the front-side of the silicon wafer,
   b. printing a paste A having fire-through capability on the ARC layer, wherein the paste A is printed as a plurality of thin parallel finger lines having gaps therein to form a bottom print of split finger lines,
   c. printing a paste B over paste A, wherein the paste B is printed in a grid pattern comprising
      i. at least two busbars intersecting the bottom print of split finger lines at right angles and interposed in the gaps therein, and
      ii. thin parallel finger lines forming a top print of finger lines superimposing the bottom print of finger lines, wherein the total printed area of pastes A and B is less than 10% of the area of the front-side, and
   d. firing the double-printed silicon wafer,
   wherein the paste A comprises,
      i. 50-95 wt % of a metal source comprising silver or a source of silver and at least one metal or source of a metal selected from the group consisting of nickel, copper, palladium, platinum, and combinations thereof,
      ii. 0.5-15 wt % of a glass component, and
      iii. 5-20 wt % of an organic vehicle,
   wherein the paste A providing lower contact resistance than paste B, when both are fired, wherein the paste B comprises an organic vehicle and an inorganic portion comprising (b1) at least one electrically conductive metal powder and (b2) glass frit, and wherein at least one of paste A or paste B further comprises 0.01 to 5 wt % of an organolithium compound.

2. The process of claim 1, wherein at least one of paste A and paste B includes a hot melt adhesive.

3. The process of claim 1, wherein the metal source includes nickel, and wherein the nickel is provided in the form of an organonickel compound.

4. The process of claim 1, wherein the glass component of paste A includes at least one Pb-containing glass frit having a softening point of 300 to 550° C., wherein the glass frit includes an oxide of a transition metal selected from the group of Mn, Fe, Co, Ni, Cu, Ti, V, Cr, W, Nb, Ta, Hf, Rh, Ru, Pd, Pt, and combinations thereof to achieve lower contact resistance and a wider firing window.

5. The process of claim 1, wherein the paste includes 0.01-10 wt % of a metal acetyl acetonate, wherein the metal of the metal acetyl acetonate is selected from the group consisting of V, Sb, Y, Co, Ni, Zr, Sn, Zn, Li, Mn, Cu, Ce, Ru, Rh, and Fe.

6. The process of claim 1, wherein paste A further comprises 0.01-10 wt % of at least one metal silicate, wherein the metal silicate has the formula:

$MaSibOc+2b$, wherein a=1, 2, or 3, b=1, 2, or 3, c=a/2, a, or 2a, and metal M is selected from the group of: Zn, Mg, Li, Mn, Co, Ni, Cu, Gd, Zr, Ce, Fe, Al, and Y.

7. The process of claim 1, wherein paste A further comprises an organozinc compound.

8. The process of claim 1, wherein paste B comprises:
   a. 40-85 wt % of a metal source comprising of the at least one electrically conductive metal powder;
   b. 0.5-15 wt % of the glass frit; and
   c. 5-20 wt % of an organic vehicle.

9. The process of claim 1, wherein the glass frit of paste B is not capable of firing through an antireflective coating.

10. The process of claim 1, wherein the Tg of the glass frit of paste B is not higher than the Tg of the glass component of paste A.

11. The process of claim 1, wherein the total proportion of the at least one electrically conductive metal powder and the glass frit in paste B is less than the total proportion of the metal source and the glass component in paste A.

12. The process of claim 1, wherein at least one of paste A and paste B is printed with an ink jet printer.

13. The process of claim 1, wherein an aspect ratio of the plurality of thin parallel finger lines printed with paste A and paste B is 0.1 to 1.

* * * * *